US008859430B2

(12) United States Patent
Chiba

(10) Patent No.: US 8,859,430 B2
(45) Date of Patent: Oct. 14, 2014

(54) SIDEWALL PROTECTION OF LOW-K MATERIAL DURING ETCHING AND ASHING

(75) Inventor: Yuki Chiba, East Greenbush, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/530,546

(22) Filed: Jun. 22, 2012

(65) Prior Publication Data

US 2013/0344699 A1    Dec. 26, 2013

(51) Int. Cl.
*H01L 21/311* (2006.01)

(52) U.S. Cl.
USPC ........... 438/695; 438/689; 438/700; 438/758; 257/686

(58) Field of Classification Search
USPC .......... 438/689, 695, 700, 758–794; 257/686; 427/255.394
See application file for complete search history.

(56) References Cited

U.S. PATENT DOCUMENTS

| 7,553,769 | B2 | 6/2009 | Toma et al. | |
|---|---|---|---|---|
| 7,723,237 | B2 | 5/2010 | Hyland et al. | |
| 7,741,224 | B2 | 6/2010 | Jiang et al. | |
| 7,795,148 | B2 | 9/2010 | Brown | |
| 2001/0005635 | A1* | 6/2001 | Kitagawa | 438/710 |
| 2003/0049571 | A1 | 3/2003 | Hallock | |
| 2006/0019485 | A1* | 1/2006 | Komai et al. | 438/627 |
| 2006/0115981 | A1 | 6/2006 | Shieh | |
| 2006/0286805 | A1* | 12/2006 | Hsu | 438/689 |
| 2009/0085173 | A1* | 4/2009 | Boemmels et al. | 257/635 |
| 2009/0148615 | A1* | 6/2009 | Vangeneugden et al. | 427/489 |
| 2009/0169968 | A1* | 7/2009 | Iseki et al. | 429/34 |
| 2009/0242385 | A1* | 10/2009 | Robison et al. | 204/192.11 |
| 2009/0286402 | A1* | 11/2009 | Xia et al. | 438/703 |
| 2010/0225003 | A1* | 9/2010 | Lagha et al. | 257/774 |
| 2011/0244142 | A1* | 10/2011 | Cheng et al. | 427/569 |
| 2011/0256726 | A1* | 10/2011 | LaVoie et al. | 438/702 |
| 2011/0256734 | A1* | 10/2011 | Hausmann et al. | 438/776 |

OTHER PUBLICATIONS

Dreyer et al. "Polycyanurate Ester Resins with Low Loss for Use in Integrated Optics." Fraunhofer Institute for Reliability & Microintegration, Teltow-Seehof, Germany, First International Conference on Polymers and Adhesives in Microelectronics and Photonics, Oct. 21-24, 2001.*
Naruse et al. ("Preparation and properties of amorphous carbon oxynitrides a-CNxOy films made by a nitrogen radical sputter method and by the layer-by-layer method." Mat. Res. Soc. Symp. Proc. vol. 675 2001 Materials Research Society).*
PCT International Search Report, USPTO, Alexandria, VA, Aug. 13, 2013.

* cited by examiner

*Primary Examiner* — Cheung Lee
*Assistant Examiner* — Stephen Bradley

(57) ABSTRACT

A method for protecting an exposed low-k surface is described. The method includes providing a substrate having a low-k insulation layer formed thereon and one or more mask layers overlying the low-k insulation layer with a pattern formed therein. Additionally, the method includes transferring the pattern in the one or more mask layers to the low-k insulation layer using one or more etching processes to form a trench and/or via structure in the low-k insulation layer. The method further includes forming an insulation protection layer on exposed surfaces of the trench and/or via structure during and/or following the one or more etching processes by exposing the substrate to a film forming compound containing C, H, and N. Thereafter, the method includes removing at least a portion of the one or more mask layers using a mask removal process.

16 Claims, 33 Drawing Sheets

SIDEWALL PROTECTION OF LOW-K MATERIAL DURING ETCHING AND ASHING

FIELD OF INVENTION

The invention relates to a method of mitigating damage to a low dielectric constant (low-k) material.

BACKGROUND OF THE INVENTION

The practical implementation of low-k materials in insulation layer stacks for metal interconnects faces formidable challenges. Ultimately, it is desirable to integrate low-k dielectric materials in metal interconnects that achieve the full benefit of the reduced dielectric constant, while producing a structurally robust, patterned insulation layer with minimal damage. As low-k damage accumulates, it manifests in metal interconnects with inferior performance and poor reliability.

SUMMARY OF THE INVENTION

Embodiments of the invention relate to a method of mitigating damage to a low dielectric constant (low-k) material.

According to one embodiment, a method for protecting an exposed low-k surface is described. The method includes providing a substrate having a low-k insulation layer formed thereon and one or more mask layers overlying the low-k insulation layer with a pattern formed therein. Additionally, the method includes transferring the pattern in the one or more mask layers to the low-k insulation layer using one or more etching processes to form a structural feature in the low-k insulation layer. The method further includes forming an insulation protection layer on exposed surfaces of the structural feature during and/or following the one or more etching processes by exposing the substrate to a film forming compound containing C, H, and N. Thereafter, the method includes removing at least a portion of the one or more mask layers using a mask removal process.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1A:
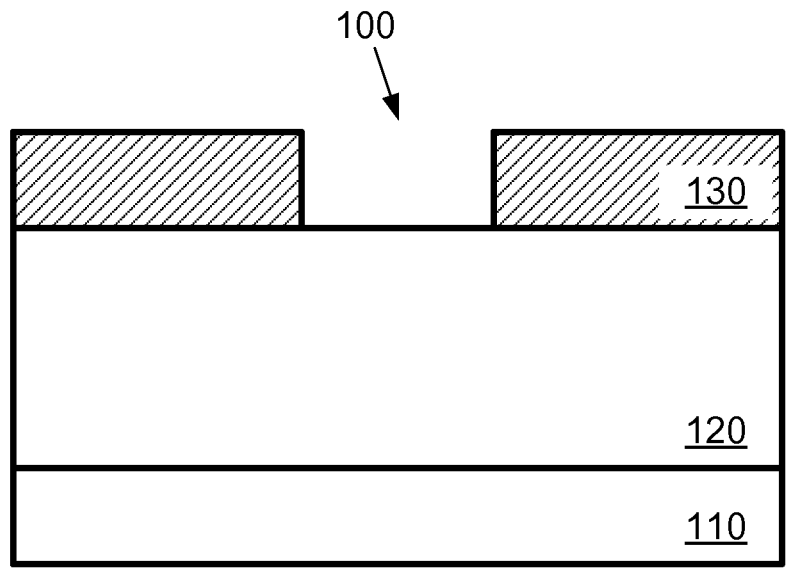
FIGS. 1A through 1C illustrate a schematic representation of a conventional method for patterning a low-k insulation layer.

As noted above in semiconductor manufacturing, when fabricating insulation layer stacks for metal interconnects, the integration of low-k materials has posed many challenges. For example, FIG. 1A provides a pictorial illustration of a conventional methodology for patterning a low-k material. The methodology begins with preparing a low-k insulation layer 120 on a substrate 110. Thereafter, a mask layer 130 having a pattern 100 formed therein is prepared overlying the low-k insulation layer 120. Pattern 100 may include a via pattern or a trench pattern.

Figure 1B:
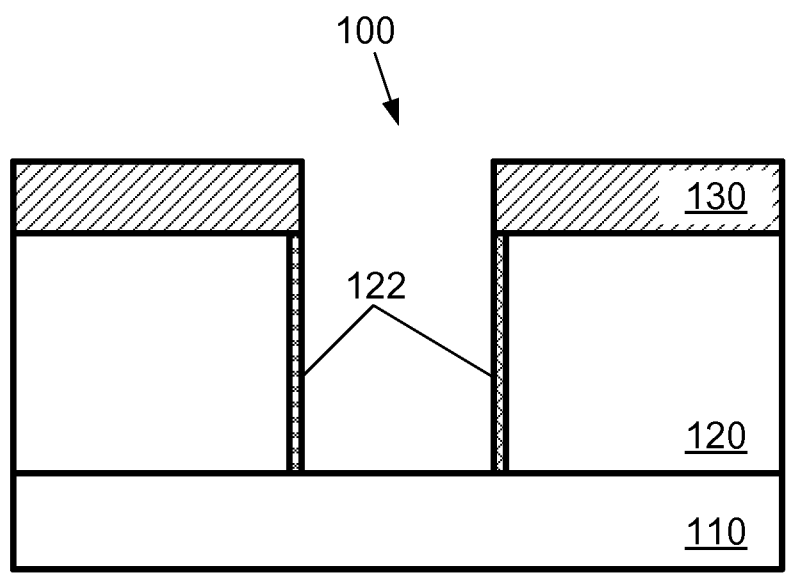
Figure 1C:
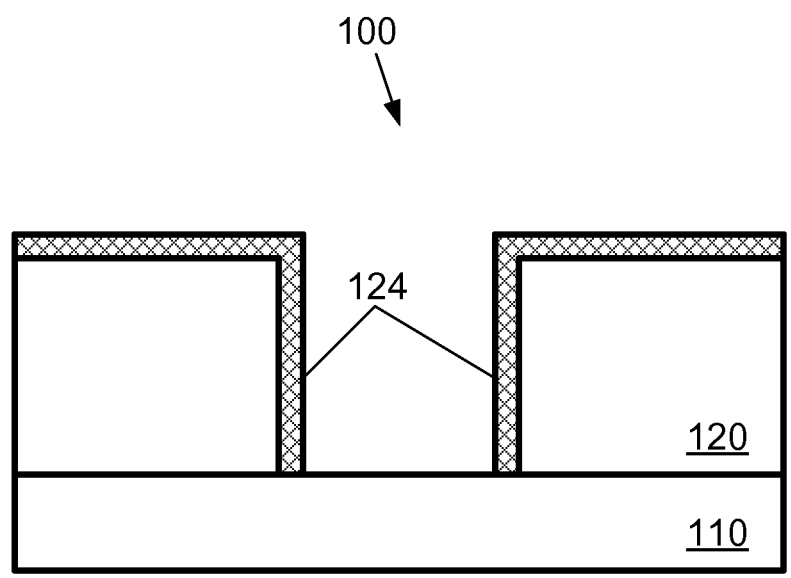

As illustrated in FIG. 1B, an etching process may be performed to transfer pattern 100 into and/or through the low-k insulation layer 120. Exposure of the low-k insulation layer 120 to the etching chemistry (e.g., plasma chemistry) may cause initial damage 122 to the low-k insulation layer 120, particularly along the sidewalls of the pattern formed therein. Furthermore, as illustrated in FIG. 1C when the remaining portion of the mask layer 130 is removed via an ashing process, additional damage 124 is incurred by the exposed portions of the low-k insulation layer 120.

When mask layer 130 contains organic material, such as photo-resist, the ashing process typically uses an oxygen-containing chemistry, such as an oxygen-containing plasma, to remove the organic material. In such cases, the oxygen-containing chemistry may lead to the depletion of carbon, as well as methyl groups (i.e., $CH_3$) in low-k insulation layer 120. The de-methylation of the low-k insulation layer 120 is particularly evident in SiCOH-containing layers. As a result, the low-k insulation layer 120 that has been damaged by these processes suffers from an increased dielectric constant, an increased leakage there through, and an increased hydrophilicity. Furthermore, this damage may manifest as sidewall bowing and sidewall undercut relative to overlying layers. As a result, when filling or metalizing the pattern 100, metal voids may occur that affect yield and reliability.

Moreover, when mask layer 130 contains a metallic material, such as a TiN metal hard mask, the ashing process typically uses a fluorine-containing chemistry, such as an $NF_3$-containing plasma, to remove the metallic material. In such cases, the fluorine-containing chemistry may lead to severe sidewall bowing and sidewall undercut relative to overlying layers. As a result, when filling or metalizing the pattern 100, metal voids may occur that affect yield and reliability.

Figure 2A:
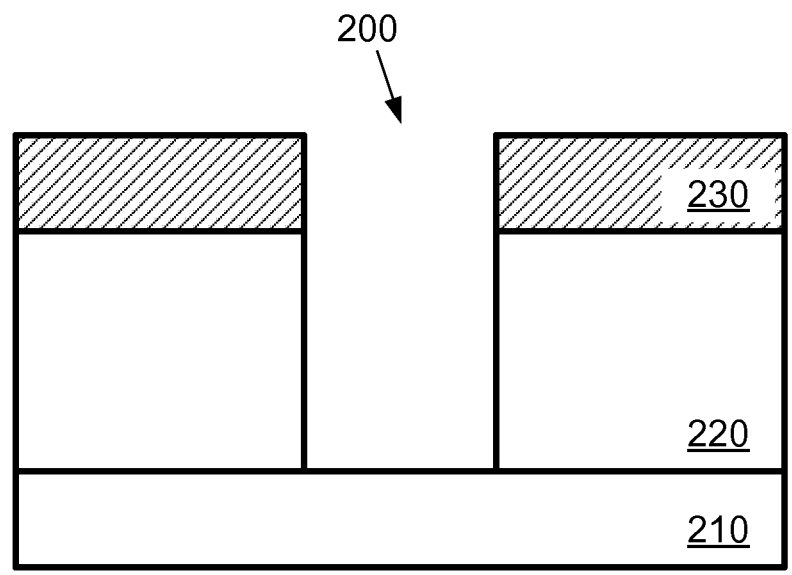
FIGS. 2A through 2E illustrate a schematic representation of a method for patterning a low-k insulation layer while protecting an exposed low-k surface according to an embodiment.

Therefore, according to various embodiments, a method for protecting an exposed low-k surface in order to reduce damage is described. The method is pictorially illustrated in FIGS. 2A through 2E, and presented by way of a flow chart 300 in FIG. 3. As illustrated in FIG. 2A and presented in FIG. 3, the flow chart 300 begins in 310 with providing a substrate 210 having one or more mask layers 230 and a low-k insulation layer 220 formed thereon, wherein a pattern is formed in the one or more mask layers 230 using a lithographic process As illustrated in FIG. 2A, in 320, the pattern has been transferred to the low-k insulation layer 220 using an etching process to form a structural feature 200 therein. Structural feature 200 may include a via, a trench or line, or a trench-via structure prepared using any variety of conventional techniques, including, but not limited to, a single damascene scheme, a dual damascene scheme, a trench-first metal hard mask (TFMHM) patterning scheme, a via-first-trench-last (VFTL) patterning scheme, etc.

Substrate 210 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate.

Low-k insulation layer 220 may include a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the low-k insulation layer 220 may have a dielectric constant of less than 3.7, or a dielectric constant of less than 2.5, or a dielectric constant ranging from 1.6 to 3.7. The low-k insulation layer 220 may be porous or non-porous.

For example, the low-k insulation layer 220 may include a SiCOH-containing material. Additionally, for example, the low-k insulation layer 220 may include a porous inorganic-organic hybrid film comprised of a single-phase, such as a silicon oxide-based matrix having $CH_3$ bonds that hinder full densification of the film during a curing or deposition process to create small voids (or pores). Still alternatively, for example, the low-k insulation layer 220 may include porous inorganic-organic hybrid film comprised of at least two phases, such as a carbon-doped silicon oxide-based matrix having pores of organic material (e.g., porogen) that is decomposed and evaporated during a curing process.

The low-k insulation layer 220 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The one or more mask layers 230 may comprise a layer of radiation-sensitive material, such as photo-resist. The photo-resist may comprise 248 nm nanometer) resist, 193 nm resist, 157 nm resist, EUV (extreme ultraviolet) resist, or electron beam sensitive resist. The photo-resist can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

Additionally, the one or more mask layers 230 may include an anti-reflective coating (ARC) layer, such as a silicon-containing ARC commercially available as Sepr-Shb Aseries SiARC from Shin Etsu Chemical Co., Ltd. The optional ARC layer may, for example, be applied using spin coating technology, or a vapor deposition process.

Furthermore, the one or more mask layers 230 may include an organic planarization layer (OPL) or organic dielectric layer (ODL). The ODL or OPL may include a photo-sensitive organic polymer or an etch type organic compound. For instance, the photo-sensitive organic polymer may be poly-acrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques or vapor deposition techniques.

Further yet, the one or more mask layers 230 may include a hard mask layer. The hard mask layer may include a metal, or metal-containing material. Additionally, the hard mask layer may include a Si-containing material or C-containing material. The Si- or C-containing material may include silicon oxide ($Si_xO_y$), silicon nitride ($Si_xN_y$), silicon oxynitride ($Si_xO_yN_z$), silicon oxycarbide ($Si_xO_yC_z$), or carbon (diamond-like carbon (DLC), amorphous carbon (a-C), or graphite), together, or any combination thereof for example.

The pattern may be formed in the one or more mask layers 230 using a sequence of lithography and optionally etching steps. Once prepared, the pattern (or series of prepared patterns) may be transferred to the underlying thin film, i.e., the low-k insulation layer 220, using one or more etching processes, such as one or more plasma etching processes.

Figure 2B:
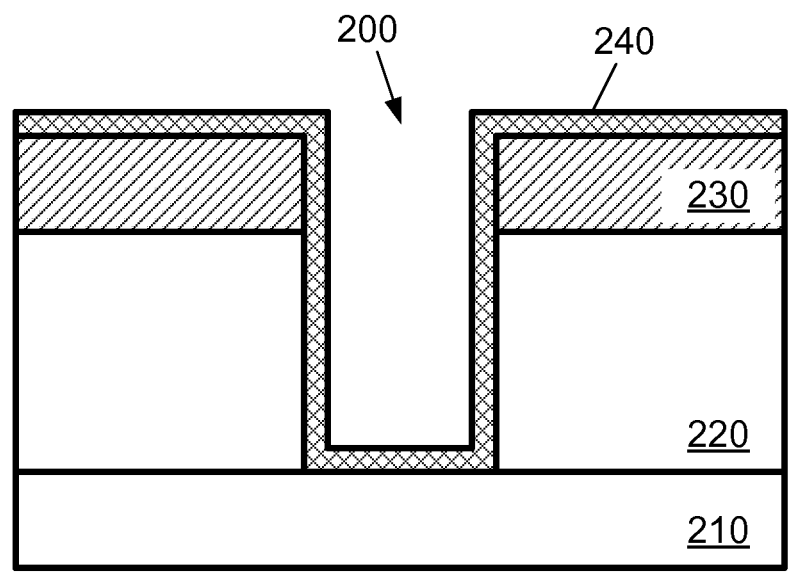
Figure 3:
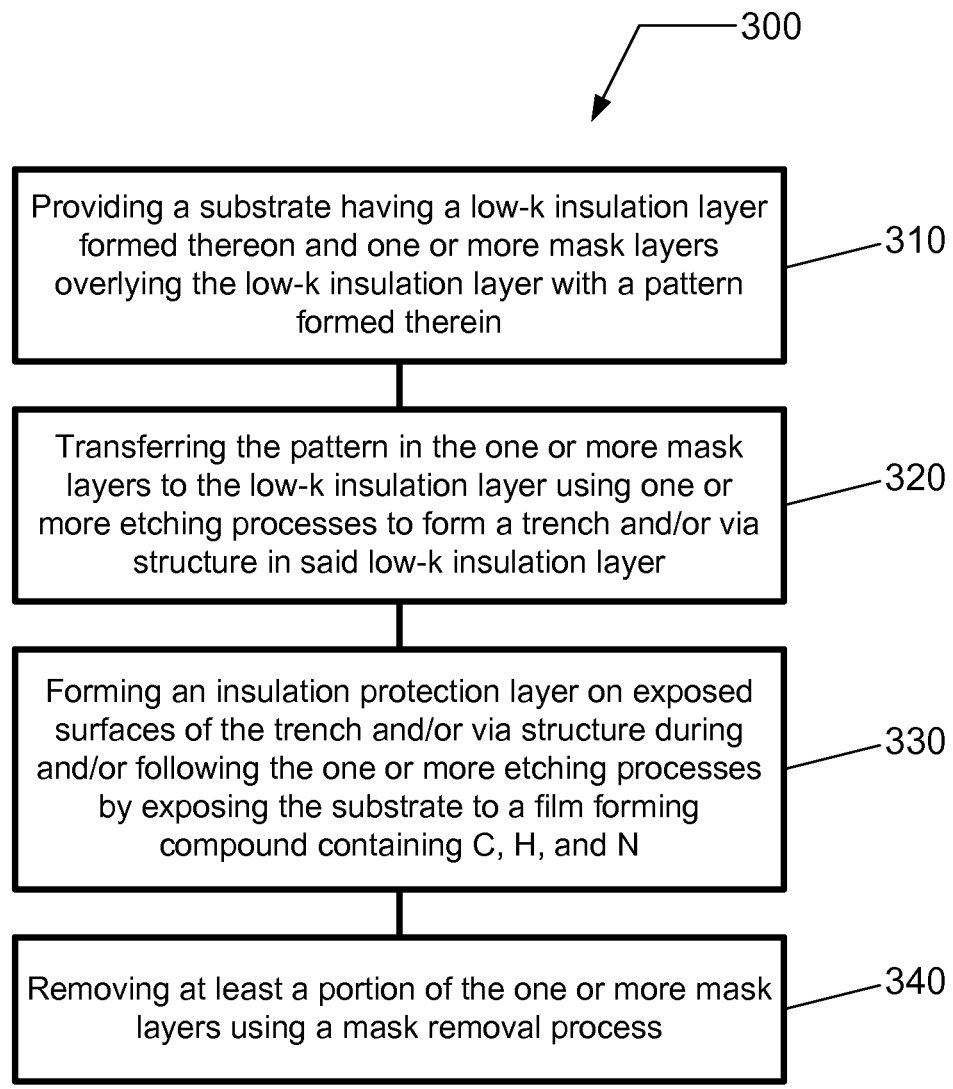
FIG. 3 provides a flow chart illustrating a method for protecting an exposed low-k surface according to an embodiment.

As illustrated in FIG. 2B, in 330, an insulation protection layer 240 is formed on exposed surfaces of the one or more mask layers 230 and the structural feature 200 formed in low-k insulation layer 220. The insulation protection layer 240 contains C and N. The insulation protection layer 240 may be formed by performing a vapor deposition process in an environment containing C, N, and optionally H. The insulation protection layer 240 may contain C, N, and optionally O. The insulation protection layer 240 may contain C, N, O, and optionally F.

In one embodiment, the insulation protection layer 240 is formed by performing a non-plasma, vapor-phase deposition process or a plasma-assisted, vapor-phase deposition process. Either deposition process may include using a film forming process composition containing as incipient ingredients a heterocyclic aromatic organic compound or an aromatic amine. The film forming process composition may include pyrrole ($C_4H_4NH$) or aniline ($C_6H_5NH_2$), viz.

Pyrrole:

Aniline:

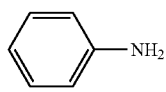

For either the non-plasma, vapor-phase deposition process or the plasma-assisted, vapor-phase deposition process, constituents of the film forming process composition should be selected that exist in a gaseous and/or vapor phase either alone or in combination with a carrier gas (e.g., a noble gas element or nitrogen) at atmospheric and/or vacuum pressures.

The plasma-assisted deposition process may include application of radio frequency (RF) or microwave power to generate plasma. However, the plasma-assisted deposition process may exclude application of a radio frequency (RF) bias to a substrate holder upon which substrate 210 rests.

Using the plasma-assisted deposition process, an RF power for generating plasma may range from about 50 W (Watts) to about 1000 W, preferably from about 50 W to about 500 W, and more preferably from about 50 W to about 200 W. A pressure may range from about 1 mTorr to about 10000 mTorr, preferably from about 100 mTorr to about 1000 mTorr, and more preferably from about 400 mTorr to about 600 mTorr. A temperature of substrate 210 may range from about 0 degrees C. to about 300 degrees C., preferably from about 30 degrees C. to about 100 degrees C., and more preferably from about 50 degrees C. to about 70 degrees C. As an example, the plasma condition for the plasma-assisted deposition process may include an RF frequency of 13.56 MHz, an RF power of 100 W (coupled to an upper electrode opposing a lower electrode upon which the substrate rests, and/or the lower electrode), a pressure of 500 mTorr, a process composition flow rate of about 30 sccm, a substrate temperature of about 60 degrees C., and an electrode spacing between the upper electrode and the lower electrode of about 30 mm.

The film thickness may range from about 5 nm to about 200 nm, preferably about 10 nm to about 100 nm, and more preferably about 30 nm to about 70 nm (e.g., about 50 nm). Furthermore, when forming the insulation protection layer 240, at least one process parameter may be adjusted in the non-plasma or plasma-assisted deposition process to alter a film thickness and/or adjust an etch resistance of the insulation protection layer 240 to a subsequent ashing/etching/cleaning process that may be used to remove at least a portion of the one or more mask layers 230.

Figure 2C:
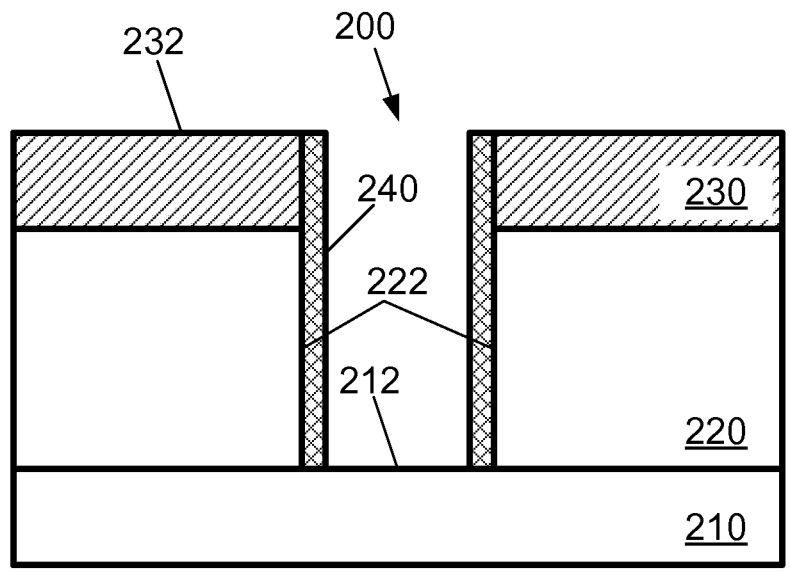

Optionally, as illustrated in FIG. 2C, the insulation protection layer 240 may be anisotropically removed from a top surface 232 of the one or more mask layers 230 and a bottom surface 212 of the structural feature 200 in the low-k insulation layer 220, while retaining a remaining portion of the insulation protection layer 240 on sidewall surfaces 222 of the structural feature 200. The removal of the insulation protection layer 240 from the top surface 232 of the one or more mask layers 230 and the bottom surface 212 of the structural feature 200 may be performed using one or more etching processes. The one or more etching process may include a dry plasma etching process or a dry non-plasma etching process.

In one embodiment, the dry plasma etching process may include an anisotropic plasma etching process. The anisotropic plasma etching process may include forming plasma from an etching process composition that contains C and F. For example, the etching process composition may include a fluorocarbon (i.e., $C_xF_y$, where x and y are equal to unity or greater).

Additionally, for example, the etching process composition may include a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the etching process composition may include a hydrocarbon (i.e., $C_xH_y$, where x and y are equal to unity or greater). Alternatively, for example, the etching process composition may include an additive gas having the chemical formula $C_xH_yR_z$, where R is a halogen element, x and y are equal to unity or greater, and z is equal to zero or greater.

Furthermore, for example, the etching process composition may include a noble gas. The etching process composition may include an oxygen-containing gas, a hydrogen-containing gas, a nitrogen-containing gas, or a carbon-containing gas, or any combination of two or more thereof. For example, the etching process composition may include $H_2$, $O_2$, $N_2$, CO, $CO_2$, $NH_3$, NO, $N_2O$, or $NO_2$, or any combination of two or more thereof. The etching process composition may further include a fluorine-containing gas, a chlorine-containing gas, a bromine-containing gas, or a halide gas. For example, the etching process composition may further include HBr, $F_2$, $Cl_2$, $Br_2$, $BCl_3$, $NF_3$, or $SF_6$.

In one embodiment, the etching process composition for the anisotropic plasma etching process may include a noble gas and one or more gases selected from the group consisting of $CF_4$, $C_4F_6$, $C_4F_8$, and $C_5F_8$. In another embodiment, the etching process composition for the anisotropic plasma etching process may include $CF_4$ and Ar.

The anisotropic plasma etching process may include preparation of an etch process recipe. The etch process recipe may include one or more process conditions defined by one or more process parameters. The one or more process conditions may be established by setting one or more process parameters, such as: setting a flow rate of each constituent of the etching process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to the lower electrode, or a source antenna or upper electrode opposing the lower electrode above the substrate; setting a temperature condition for the plasma processing system; setting a temperature condition for the substrate or substrate holder; setting an etch time; and/or setting an over-etch time. During the anisotropic plasma etching process, any one of the process parameters may be varied.

The anisotropic plasma etching process may include application of a radio frequency (RF) bias to a substrate holder upon which substrate 210 rests. A temperature of substrate 210 may range from about 0 degrees C. to about 100 degrees C. Furthermore, when performing the anisotropic plasma etching process, at least one process parameter may be adjusted in the anisotropic plasma etching process to control a critical dimension (CD) of the structural feature 200, a sidewall profile of the structural feature 200, etc.

In another embodiment, an over-etch process may be performed.

Figure 2D:
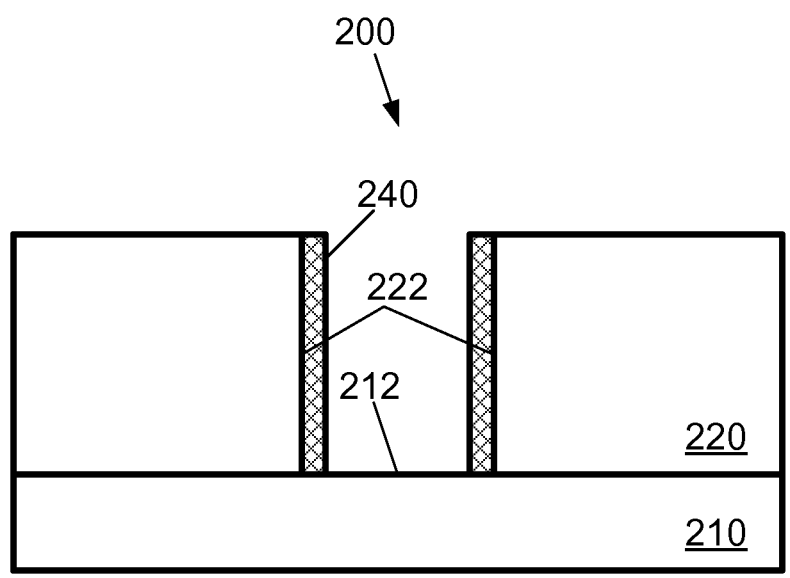

As illustrated in FIG. 2D, in 340, a mask removal process is performed to remove at least a portion of the one or more mask layers 230. The mask removal process may include one or more ashing/etching/stripping steps.

In one embodiment, the mask removal process may include a plasma ashing process. For example, the plasma ashing process may include generating plasma using a process composition containing O, N, or H, or any combination of two or more thereof. In another embodiment, the mask removal process may include exposing substrate 210 to an oxygen-containing environment. The oxygen-containing environment may include monatomic oxygen (O), diatomic oxygen ($O_2$), triatomic oxygen (ozone, $O_3$), an oxygen-containing molecule, ionized oxygen, metastable oxygen, or any excited state of oxygen, or any combination of two or more thereof. For example, the oxygen-containing environment may contain O, $O_2$, $O_3$, CO, $CO_2$, NO, $N_2O$, or $NO_2$, or any combination of two or more thereof. Additionally, for example, the oxygen-containing environment may include $O_2$.

Figure 2E:
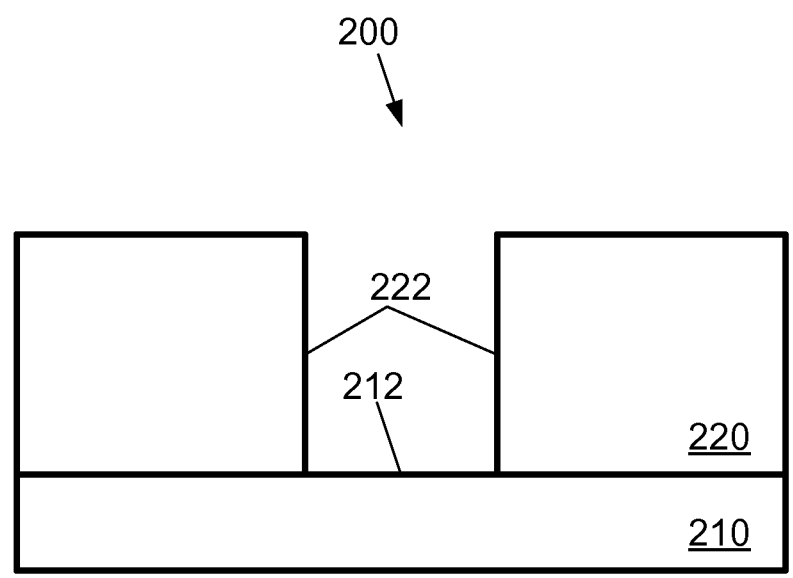

Optionally, as illustrated in FIG. 2E, following the performing of the mask removal process, any remaining portion of the insulation protection layer 240 may be selectively removed from the sidewall surfaces 222 of structural feature 200. In one embodiment, the selective removal of the remaining portion of the insulation protection layer 240 from the sidewall surfaces 222 of the structural feature 200 is achieved by performing a dry or wet cleaning process. For example, the wet cleaning process may include immersing the remaining portion of the insulation protection layer in an HF solution, such as a dilute aqueous HF solution.

In one embodiment, the deposition process for forming the insulation protection layer, the optional anisotropic plasma etching process, and the mask removal process are performed in the same plasma processing system. In an alternate embodiment, the deposition process for forming the insulation protection layer, the optional anisotropic plasma etching process, and the mask removal process are performed in separate plasma processing systems.

In another embodiment, at least two of the formation of the insulation protection layer, the optional anisotropic plasma etching process, and the mask removal process are repeated multiple cycles, e.g., two or more cycles until the sidewall surfaces 222 of structural feature 200 are adequately protected.

Figure 4A:
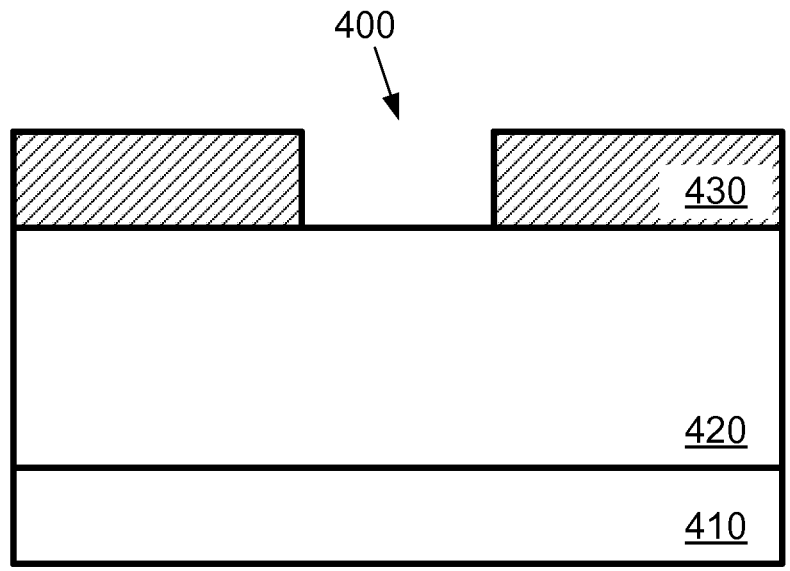
FIGS. 4A through 4F illustrate a schematic representation of a method for patterning a low-k insulation layer while protecting an exposed low-k surface according to another embodiment.

According to another embodiment, a method for protecting an exposed low-k surface to reduce damage is described. The method is pictorially illustrated in FIGS. 4A through 4F. As illustrated in FIG. 4A, a substrate 410 having a mask layer 430 and a low-k insulation layer 420 formed thereon is received, wherein a pattern has been formed in the mask layer 430 using a lithographic process and optionally one or more etching process.

Figure 4B:
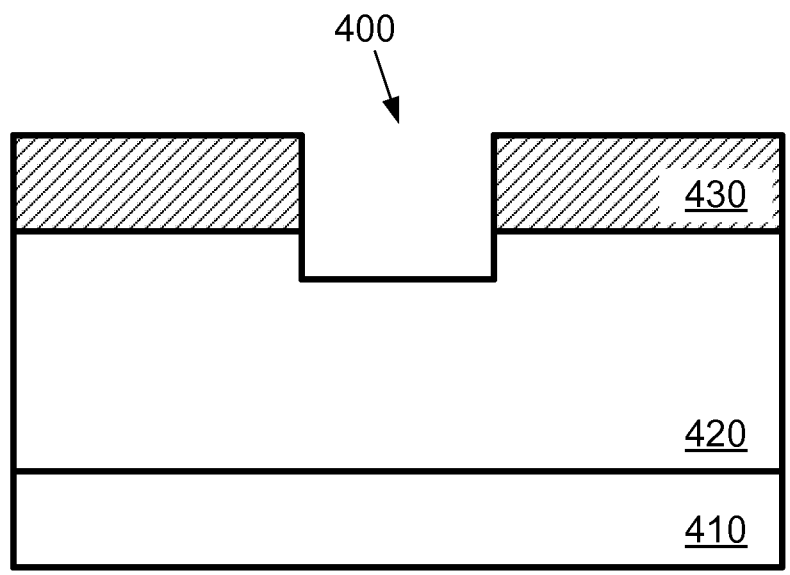

As illustrated in FIG. 4B, the pattern is partially transferred from the mask layer 430 to the low-k insulation layer 420 using one or more etching processes to form at least the initial stage of a structural feature 400 therein. Structural feature 400 may include a via, a trench or line, or a trench-via structure prepared using or according to any variety of conventional techniques, including, but not limited to, a single damascene scheme, a dual damascene scheme, trench-first metal hard mask (TFMHM) patterning scheme, a via-first-trench-last (VFTL) patterning scheme, etc.

Figure 4C:
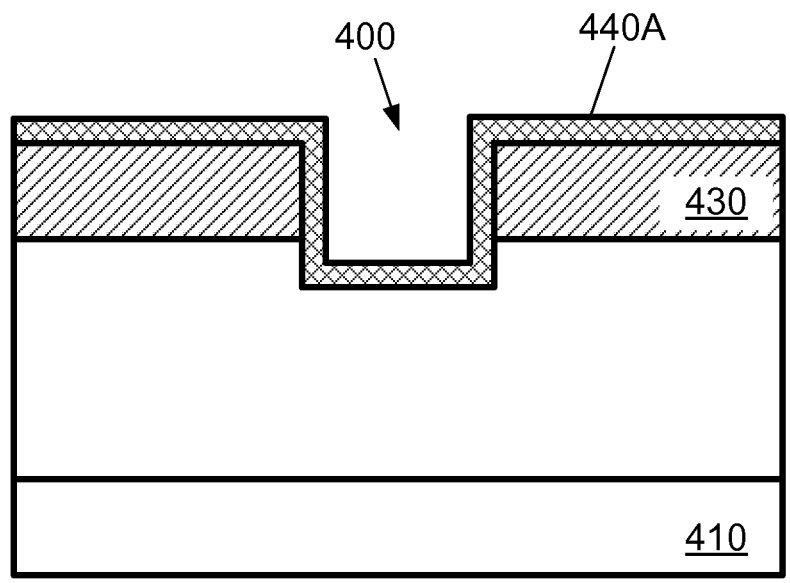
Figure 4D:
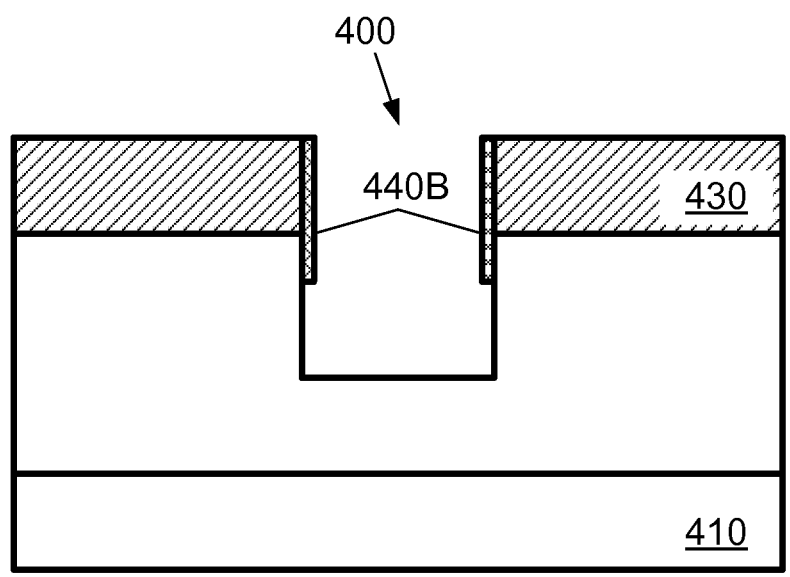

As illustrated in FIG. 4C, an insulation protection layer 440A is formed on exposed surfaces of the mask layer 430 and the structural feature 400 partially formed in the low-k insulation layer 420. Thereafter, as illustrated in FIG. 4D, the structural feature 400 is evolved deeper into the low-k insulation layer 420 using one or more additional etching processes. As shown in FIG. 4D, during the one or more additional etching processes, the insulation protection layer 440A may be at least partially removed from the mask layer 430 and possibly thinned along the sidewalls of the structural feature 400 in low-k insulation layer 420 to leave a residual insulation protection layer 440B. However, the presence of the residual insulation protection layer 440B on the sidewalls of the evolving structural feature 400 may reduce interaction of the low-k insulation layer 420 with the etching chemistry, e.g., plasma chemistry, of the one or more additional etching process.

Figure 4E:
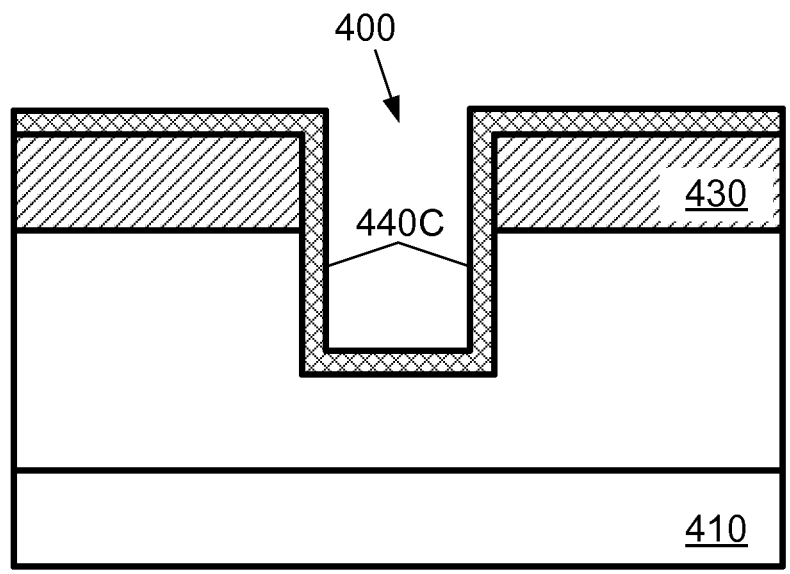
Figure 4F:
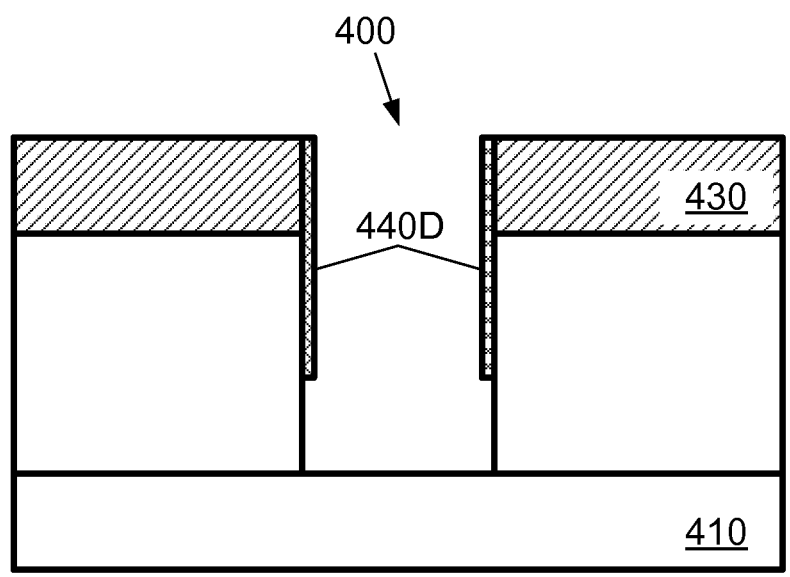

Then, as illustrated in FIG. 4E, an additional insulation protection layer 440C is formed on exposed surfaces of the mask layer 430 and the structural feature 400 partially formed in the low-k insulation layer 420. Thereafter, as illustrated in FIG. 4F, the structural feature 400 is evolved even deeper into the low-k insulation layer 420 using one or more yet additional etching processes. As shown in FIG. 4F, during the one or more yet additional etching processes, the additional insulation protection layer 440C may be at least partially removed from the mask layer 430 and possibly thinned along the sidewalls of the structural feature 400 in low-k insulation layer 420 to leave an additional residual insulation protection layer 440D. The sequence of steps performed during formation of the structural feature 400 into and through low-k insulation layer 420 may protect the sidewalls of the evolving structural feature 400 and reduce damage as the sidewalls of the structural feature are exposed to the etching chemistry.

The etch-deposit-etch-deposit (etc.) scheme described in FIGS. 4A through 4F may be utilized to protect exposed surfaces of the low-k insulation layer 420 while the structural feature 400 evolves during patterning, thus, limiting interaction between the low-k insulation layer 420 and the etch chemistry. The limited interaction may reduce the damage to the low-k insulation layer 420.

In other embodiments, when the mask layer contains a metal, such as Ti or TiN, the process for removing the mask layer typically uses a fluorine-containing chemistry, such as a fluorine-containing plasma, to remove the metal-containing material. For instance, $NF_3$-based plasma has been used to remove metal hard mask layers containing TiN. However, fluorine-containing plasma etching may cause, among other things, mask undercut and sidewall bowing of the pattern formed in the low-k insulation layer, chamfer erosion, metal contamination of the low-k insulation layer due to sputtering and redeposition of the sputtered metal.

Figure 5:
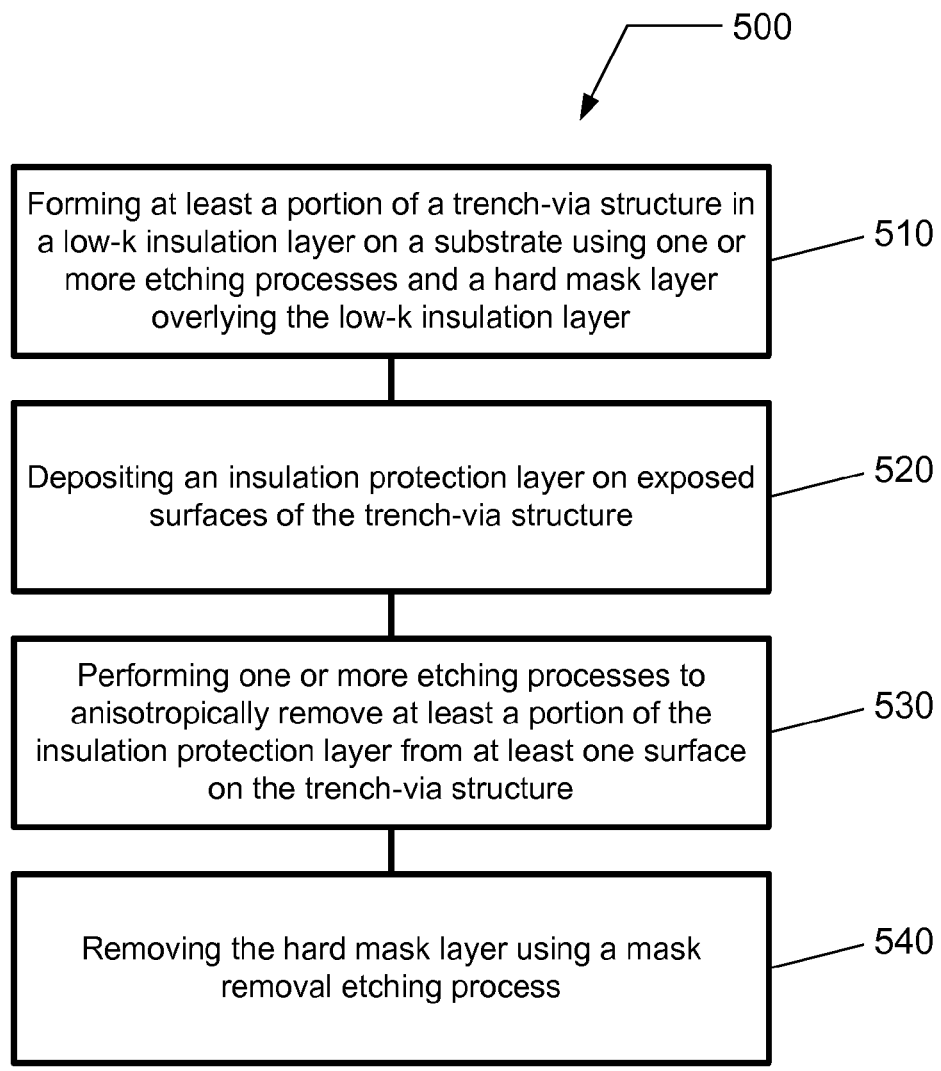
FIG. 5 illustrates a method for protecting an exposed low-k surface when removing a mask layer according to an embodiment.

Therefore, according to various embodiments, a method for protecting an exposed low-k surface in order to reduce damage when removing a mask layer is described. The method is presented by way of a flow chart 500 in FIG. 5. As shown in FIG. 5, the flow chart 500 begins in 510 with forming at least a portion of a trench-via structure in a low-k insulation layer on a substrate using one or more etching processes and a hard mask layer overlying the low-k insulation layer. The trench-via structure may be prepared using any variety of conventional techniques, including, but not limited to, a single damascene integration scheme, a dual damascene integration scheme, a trench-first metal hard mask (TFMHM) integration scheme, a via-first-trench-last (VFTL) integration scheme, etc.

Figure 6A:
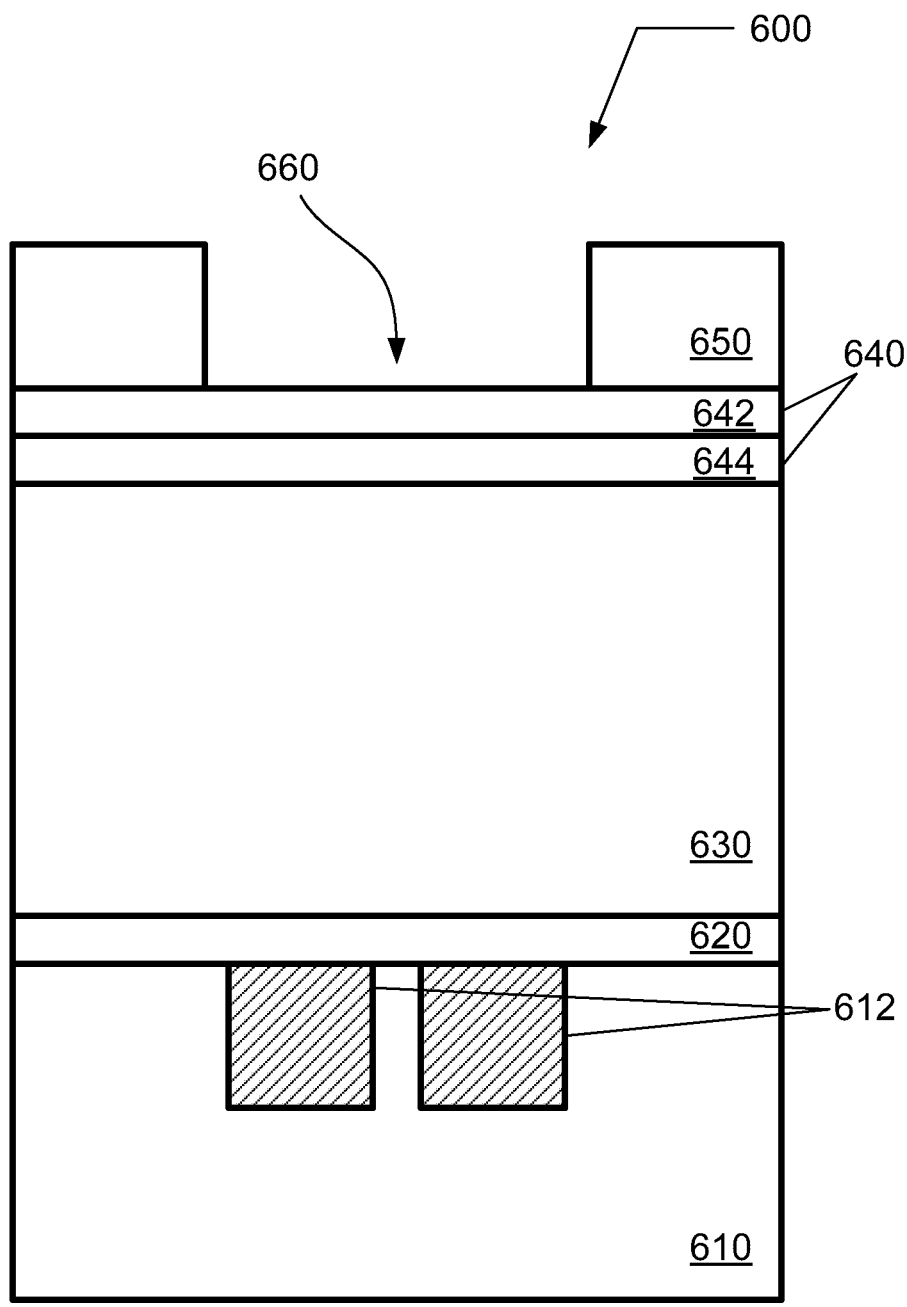
FIGS. 6A through 6J illustrate a schematic representation of a method for patterning a low-k insulation layer while protecting an exposed low-k surface when removing a mask layer according to an embodiment.

As an example, FIGS. 6A through 6J pictorially illustrate a TFMHM integration scheme for creating a trench-via structure 600 in a low-k insulation layer 630. As illustrated in FIG. 6A, a substrate 610 is received having the low-k insulation layer 630 formed thereon, and at least one hard mask layer 640 overlying the low-k insulation layer 630. The at least one hard mask layer 640 may include a first hard mask layer 644 overlying the low-k insulation layer 630, and a second hard mask layer 642 overlying the first hard mask layer 644. Additionally, at least one cap layer 620 may be inserted between the low-k insulation layer 630 and substrate 610.

As shown in FIGS. 6A through 6J, the trench-via structure 600 is formed in the low-k insulation layer 630 as well as a collection of other layers. Thereafter, the trench-via structure 600 is lined with one or more conformal thin films, wherein the one or more conformal thin films include a metal barrier layer, a metal adhesion layer, or a metal seed layer, or any combination of two or more thereof. After the liner is formed, the trench-via structure 600 is filled with metal, such as Cu, and planarized using, for example, chemical-mechanical planarization (CMP) to form a metal interconnect and achieve electrical contact to a metal line(s) 612 in substrate 610.

The substrate 610 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate. As described above, substrate 610 may include other layers, such as other interconnect layers previously formed to which electrical contact is to be made.

Low-k insulation layer 630 may include a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the low-k insulation layer 630 may have a dielectric constant of less than 3.7, or a dielectric constant of less than 2.5, or a dielectric constant ranging from 1.6 to 3.7. The low-k insulation layer 630 may be porous or non-porous.

For example, the low-k insulation layer 630 may include a SiCOH-containing material. Additionally, for example, the low-k insulation layer 630 may include a porous inorganic-organic hybrid film comprised of a single-phase, such as a silicon oxide-based matrix having $CH_3$ bonds that hinder full densification of the film during a curing or deposition process to create small voids (or pores). Still alternatively, for example, the low-k insulation layer 630 may include porous inorganic-organic hybrid film comprised of at least two phases, such as a carbon-doped silicon oxide-based matrix having pores of organic material (e.g., porogen) that is decomposed and evaporated during a curing process.

The low-k insulation layer 630 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

As described above, the at least one hard mask layer 640 may include first hard mask layer 644 overlying the low-k insulation layer 630, and second hard mask layer 642 overlying the first hard mask layer 644. The first hard mask layer 644 may include a Si-containing material or C-containing material. The Si- or C-containing material may include silicon oxide ($Si_xO_y$), silicon nitride ($Si_xN_y$), silicon oxynitride ($Si_xO_yN_z$), silicon oxycarbide ($Si_xO_yC_z$), or carbon (diamond-like carbon (DLC), amorphous carbon (a-C), or graphite), together, or any combination thereof for example. Additionally, the second hard mask layer 642 may include a metal, or a metal-containing material. The second hard mask layer 642 may include titanium (Ti), titanium nitride ($TiN_y$), tantalum (Ta), tantalum nitride ($TaN_y$), aluminum (Al), or aluminum-copper alloy (Al—Cu). For example, the second hard mask layer 642 may include Ti or TiN.

The cap layer 620 may include a single layer or multiple layers. For example, the cap layer 620 may include a nitrogen doped silicon carbide or Si—N—C—H. Furthermore, for example, the cap layer 620 may include silicon nitride ($SiN_y$), silicon carbide ($SiC_y$), silicon carbonitride ($SiC_xN_y$), or $SiC_xN_yH_z$, or a combination of two or more thereof. The cap layer 620 can be formed using a vapor deposition process, such as chemical vapor deposition (CVD), or plasma enhanced CVD (PECVD). Furthermore, the cap layer 620 may include a graded layer disposed between the low-k insulation layer 630 and the cap layer 620, and/or between the cap layer 620 and the substrate 610.

As shown in FIG. 6A, a first lithographic mask layer 650 is prepared with a trench pattern 660 formed therein on the second hard mask layer 642. The first lithographic mask layer 650 may comprise a layer of radiation-sensitive material, such as photo-resist. The photo-resist may comprise 248 nm nanometer) resist, 193 nm resist, 157 nm resist, EUV (extreme ultraviolet) resist, or electron beam sensitive resist. The photo-resist can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

Additionally, the first lithographic mask layer 650 may include an anti-reflective coating (ARC) layer, such as a silicon-containing ARC commercially available as Sepr-Shb Aseries SiARC from Shin Etsu Chemical Co., Ltd. The optional ARC layer may, for example, be applied using spin coating technology, or a vapor deposition process.

Furthermore, the first lithographic mask layer 650 may include an organic planarization layer (OPL) or organic dielectric layer (ODL). The ODL or OPL may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques or vapor deposition techniques.

The trench pattern 660 may be formed in the first lithographic mask layer 650 using a sequence of lithography and optionally etching steps. Once prepared, the pattern (or series of prepared patterns) may be transferred to the underlying thin film, i.e., the at least one hard mask layer 640 and the low-k insulation layer 630, using one or more etching processes, such as one or more plasma etching processes.

Figure 6B:
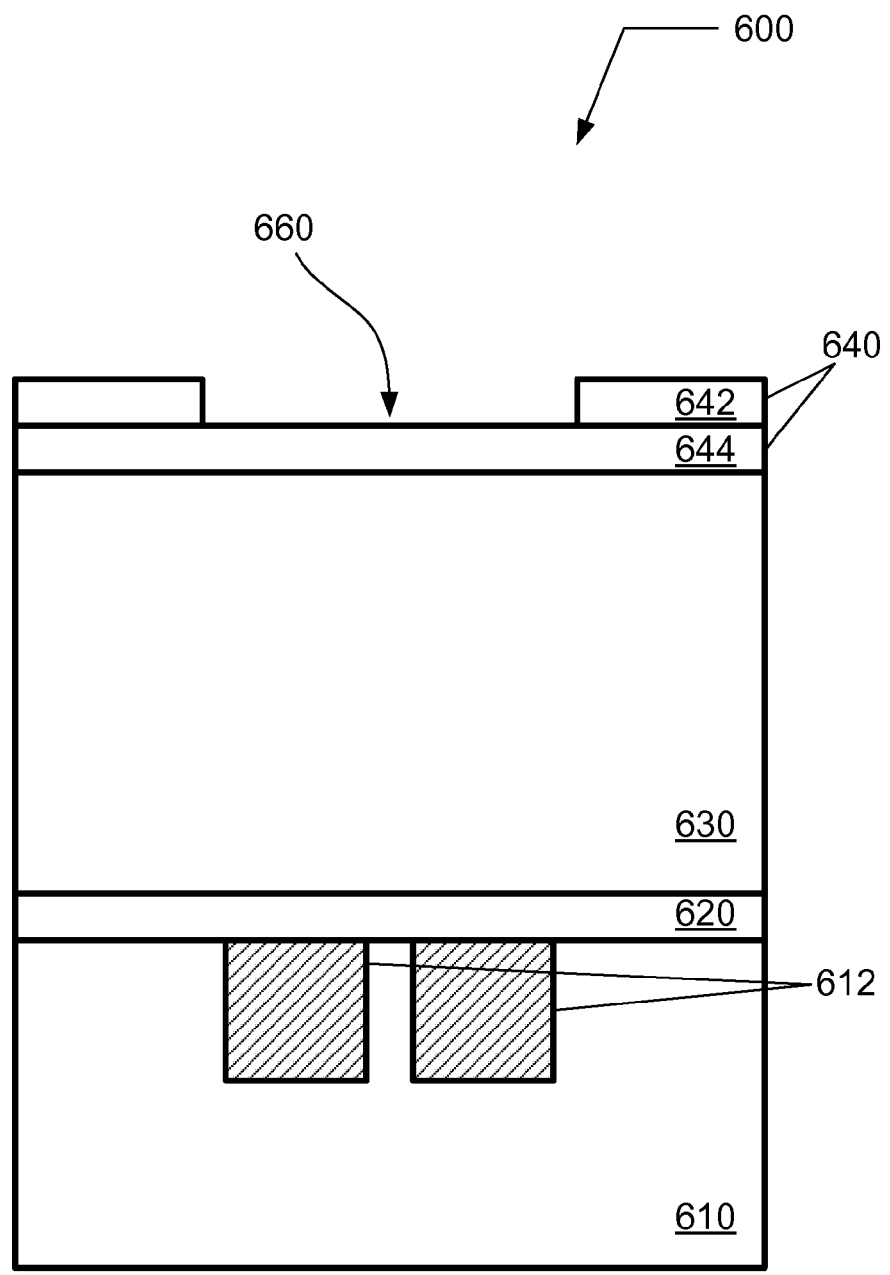

As shown in FIG. 6B, the trench pattern 660 is transferred into the second hard mask layer 642, and the transfer of the trench pattern 660 is stopped on the first hard mask layer 644. The transfer of the trench pattern 660 into the second hard mask layer 642 includes performing one or more etching processes, such as one or more plasma etching processes. Thereafter, the first lithographic mask layer 650 is removed using one or more ashing and/or stripping processes.

Figure 6C:
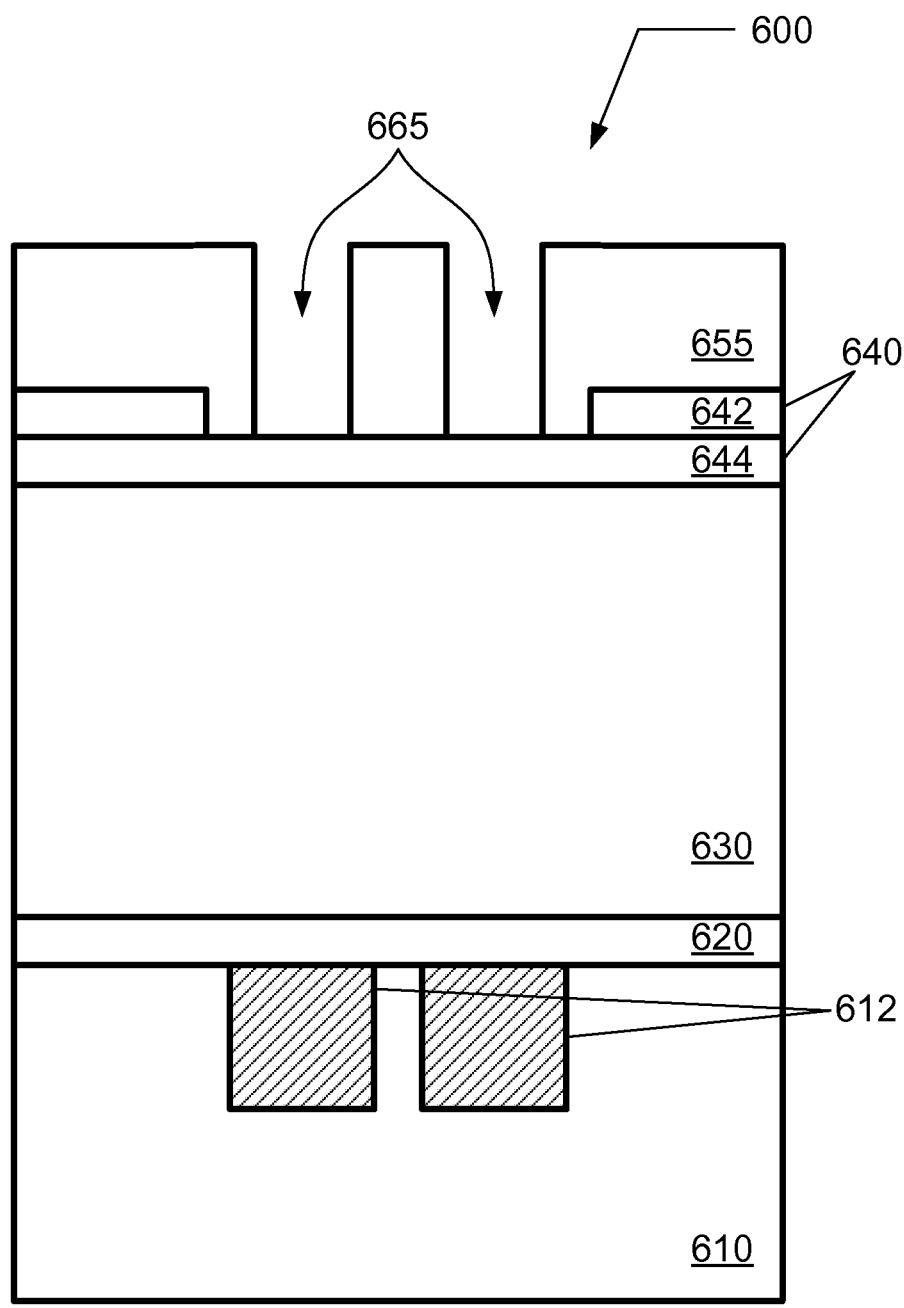

As shown in FIG. 6C, a second lithographic mask layer 655 is prepared with a via pattern 665 formed therein on the second hard mask layer 642. The second lithographic mask layer 655 may comprise a layer of radiation-sensitive material, such as photo-resist. The photo-resist may comprise 248 nm nanometer) resist, 193 nm resist, 157 nm resist, EUV (extreme ultraviolet) resist, or electron beam sensitive resist. The photo-resist can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

Figure 6D:
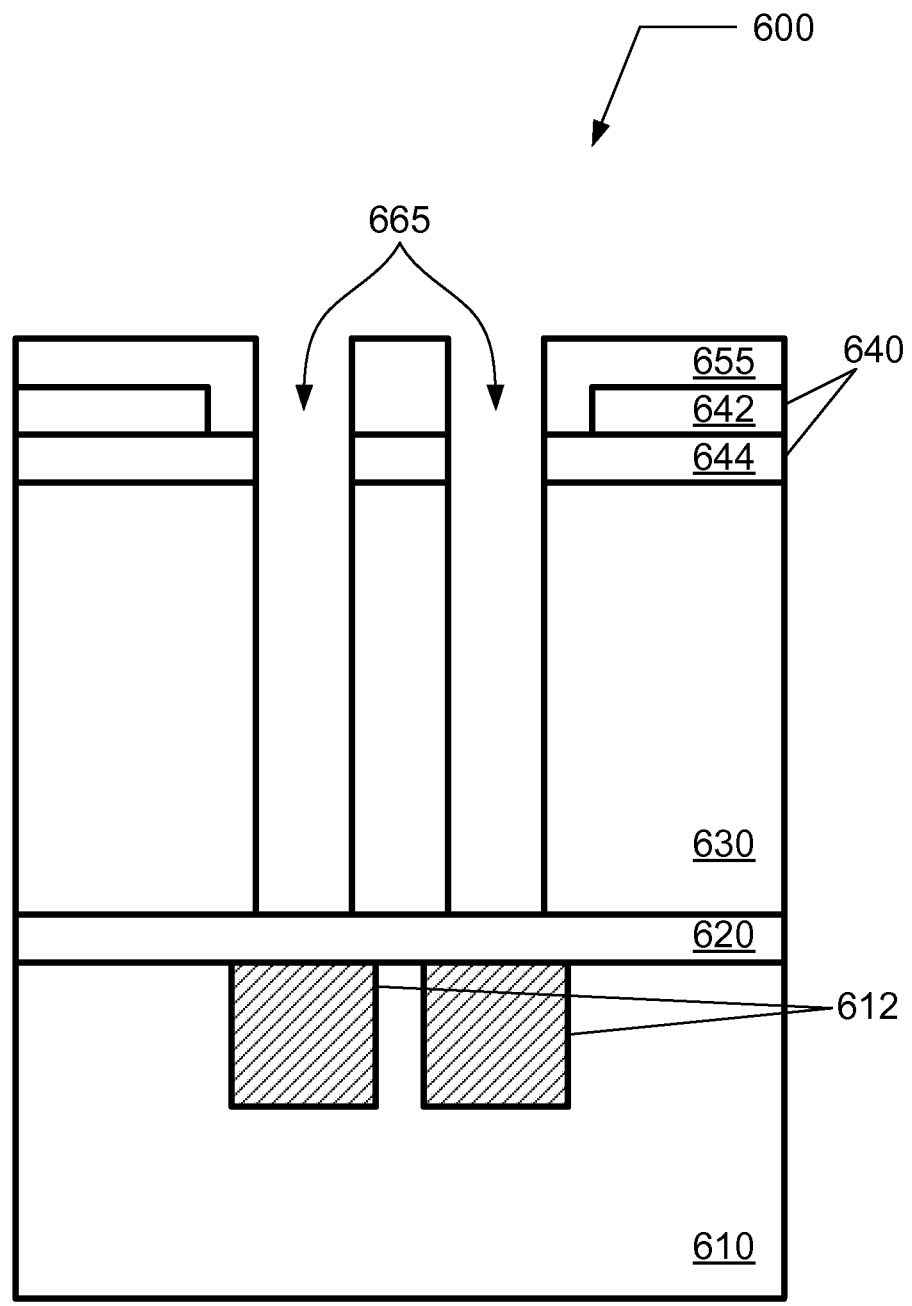
Figure 6E:
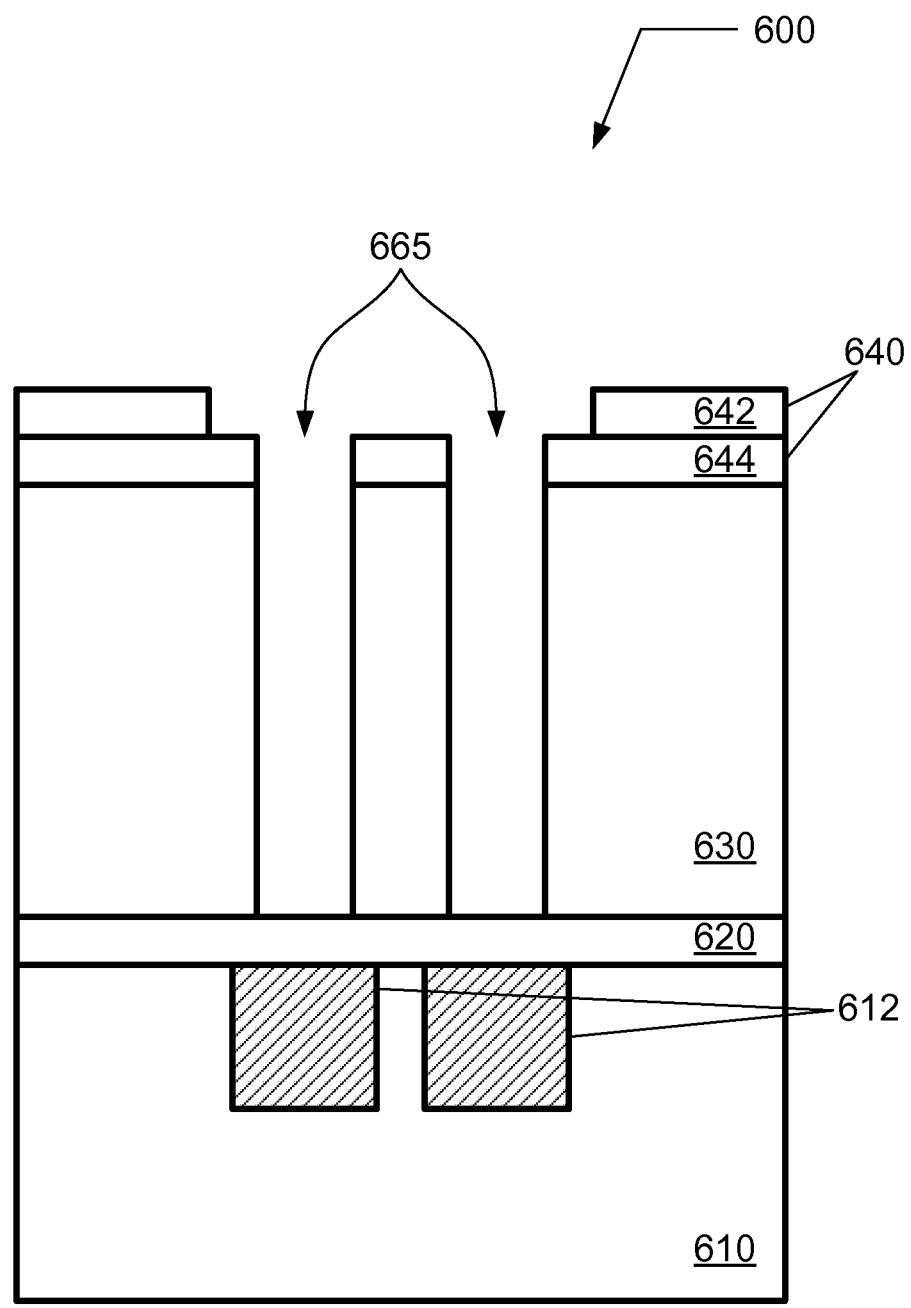

As shown in FIG. 6D, the via pattern 665 is transferred through the first hard mask layer 644, and at least partially through the low-k insulation layer 630. The transfer of the via pattern 665 into the low-k insulation layer 630 includes performing one or more etching processes, such as one or more plasma etching processes. Thereafter, as shown in FIG. 6E, the second lithographic mask layer 655 is removed using one or more ashing and/or stripping processes.

Figure 6F:
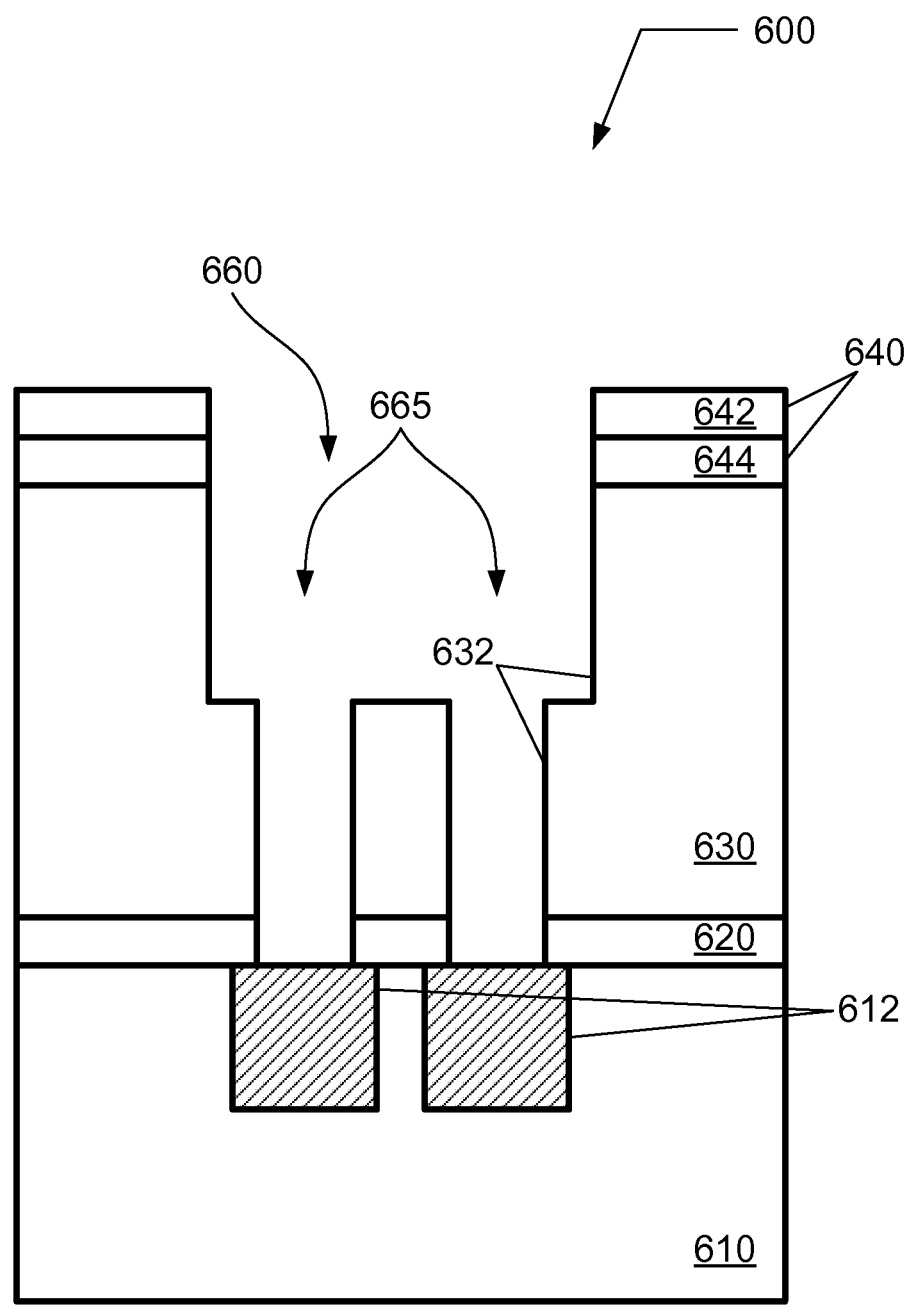

As shown in FIG. 6F, the trench pattern 660 in the second hard mask layer 642 is transferred through the first hard mask layer 644 and into the low-k insulation layer 630 to a predetermined depth to form trench-via structure 600. During the transfer of the trench pattern 660 to the low-k insulation layer 630, the via pattern 665 may be completely transferred through the low-k insulation layer 630 and/or through the cap layer 620 to expose sidewall surfaces 632.

Figure 6G:
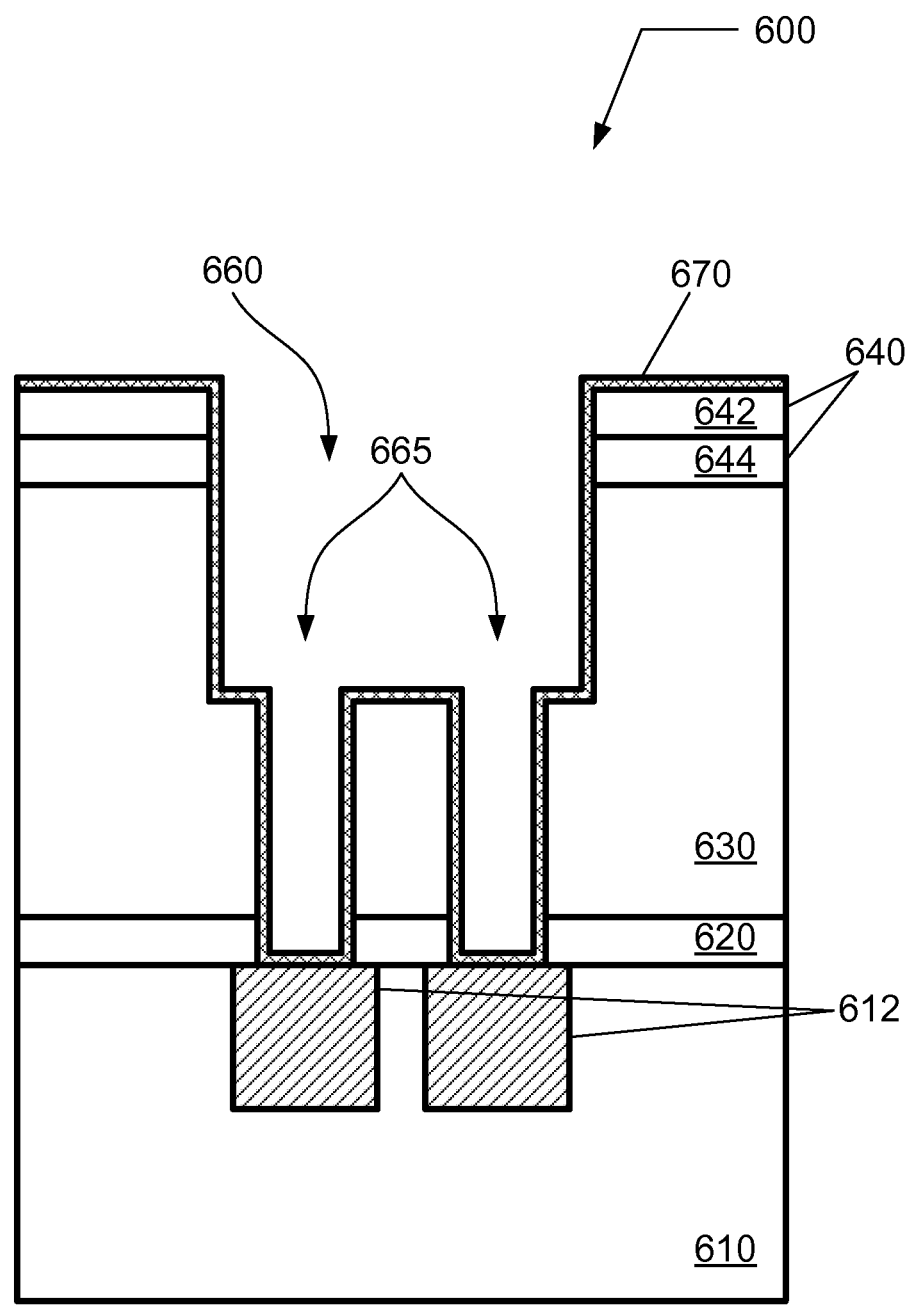

In 520 and as shown in FIG. 6G, an insulation protection layer 670 is deposited on exposed surfaces of the trench-via structure 600. The insulation protection layer 670 contains C and N. The insulation protection layer 670 may be formed by performing a vapor deposition process in an environment containing C, N, and optionally H. The insulation protection layer 670 may contain C, N, and optionally O. The insulation protection layer 670 may contain C, N, O, and optionally F.

In one embodiment, the insulation protection layer 670 is formed by performing a non-plasma, vapor-phase deposition process or a plasma-assisted, vapor-phase deposition process. Either deposition process may include using a film forming process composition containing as incipient ingredients a heterocyclic aromatic organic compound or an aromatic amine. The film forming process composition may include pyrrole ($C_4H_4NH$) or aniline ($C_6H_5NH_2$).

Figure 6H:
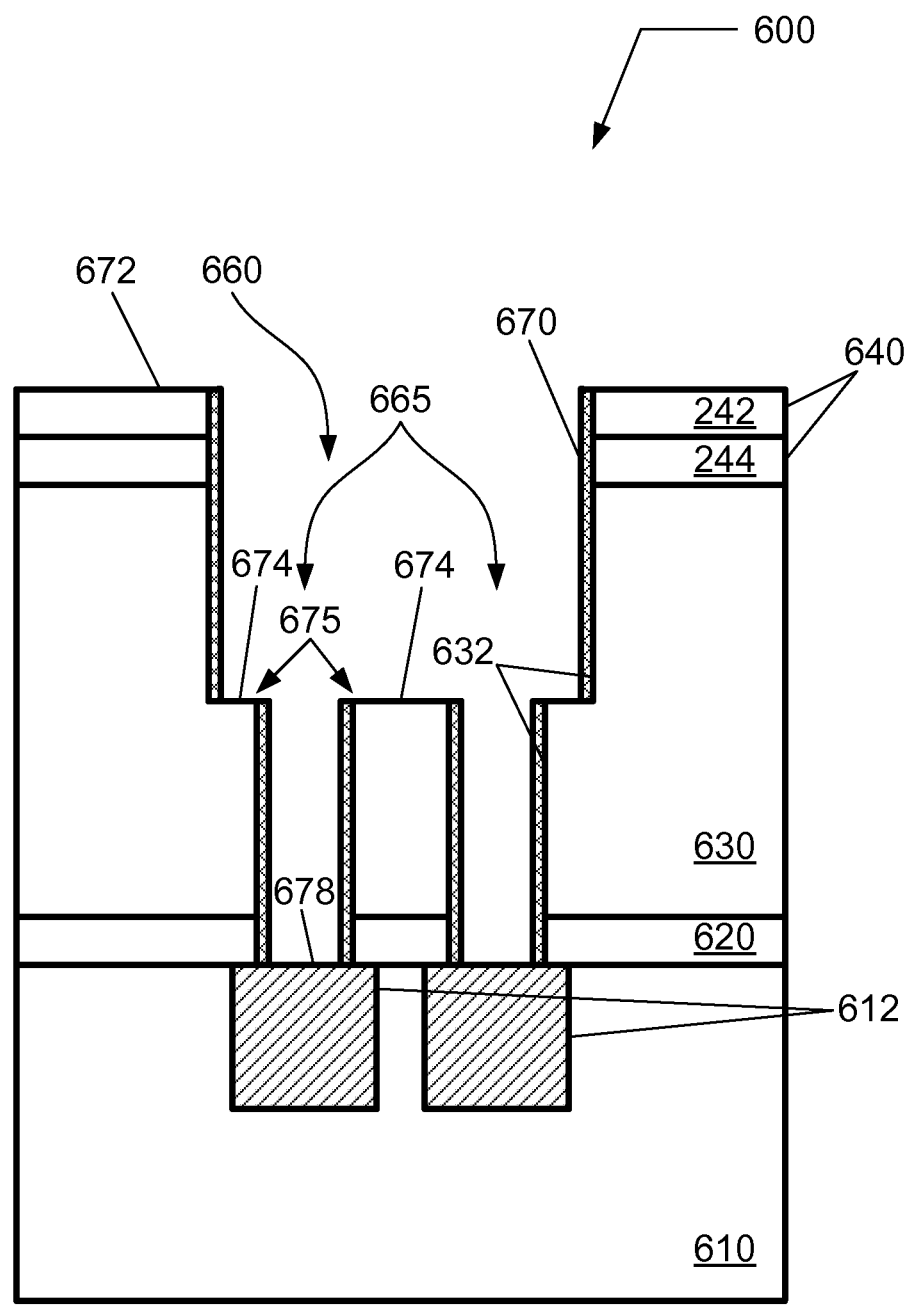

In 530 and as shown in FIG. 6H, one or more etching processes may optionally be performed to anisotropically remove at least a portion of the insulation protection layer 670 from at least one surface on the trench-via structure 600. For example, the insulation protection layer 670 may be anisotropically removed from a top surface 672 of the second hard mask layer 642, a bottom surface 674 of the trench pattern 660, and a bottom surface 678 of via pattern 665, while retaining a remaining portion of the SiOCl-containing layer on sidewall surfaces 632 of the trench-via structure 600. The remaining portion of the insulation protection layer 670 in the trench-via structure 600 may protect the sidewall surfaces 632 and a chamfer 675 at corners where sidewall surfaces 632 of via pattern 665 meet the bottom surface 674 of the trench pattern 660. The removal of the SiOCl-containing layer from at least one surface on the trench-via structure 600 may be performed using one or more etching processes. The one or more etching process may include a dry plasma etching process or a dry non-plasma etching process.

In one embodiment, the dry plasma etching process includes an anisotropic plasma etching process. The anisotropic plasma etching process may include forming plasma from an etching process composition that contains C and F. For example, the etching process composition may include a fluorocarbon (i.e., $C_xF_y$, where x and y are equal to unity or greater).

Additionally, for example, the etching process composition may include a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the etching process composition may include a hydrocarbon (i.e., $C_xH_y$, where x and y are equal to unity or greater). Alternatively, for example, the etching process composition may include an additive gas having the chemical formula $C_xH_yR_z$, where R is a halogen element, x and y are equal to unity or greater, and z is equal to zero or greater.

Furthermore, for example, the etching process composition may include a noble gas. The etching process composition may include an oxygen-containing gas, a hydrogen-containing gas, a nitrogen-containing gas, or a carbon-containing gas, or any combination of two or more thereof. For example, the etching process composition may include $H_2$, $O_2$, $N_2$, CO, $CO_2$, $NH_3$, NO, $N_2O$, or $NO_2$, or any combination of two or more thereof. The etching process composition may further include a fluorine-containing gas, a chlorine-containing gas, a bromine-containing gas, or a halide gas. For example, the etching process composition may further include HBr, $F_2$, $Cl_2$, $Br_2$, $BCl_3$, $NF_3$, or $SF_6$.

In one embodiment, the etching process composition for the anisotropic plasma etching process may include a noble gas and one or more gases selected from the group consisting of $CF_4$, $C_4F_6$, $C_4F_8$, and $C_5F_8$. In another embodiment, the etching process composition for the anisotropic plasma etching process may include $CF_4$ and Ar.

The anisotropic plasma etching process may include preparation of an etch process recipe. The etch process recipe may include one or more process conditions defined by one or more process parameters. The one or more process conditions may be established by setting one or more process parameters, such as: setting a flow rate of each constituent of the etching process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to the lower electrode, or a source antenna or upper electrode opposing the lower electrode above the substrate; setting a temperature condition for the plasma processing system; setting a temperature condition for the substrate or substrate holder; setting an etch time; and/or setting an over-etch time. During the anisotropic plasma etching process, any one of the process parameters may be varied.

The anisotropic plasma etching process may include application of a radio frequency (RF) bias to a substrate holder upon which substrate 610 rests. A temperature of substrate 610 may range from about 0 degrees C. to about 100 degrees C. Furthermore, when performing the anisotropic plasma etching process, at least one process parameter may be adjusted in the anisotropic plasma etching process to control a critical dimension (CD) of the trench-via structure 600, a sidewall profile of the trench-via structure 600, etc.

In another embodiment, an over-etch process may be performed.

Figure 6I:
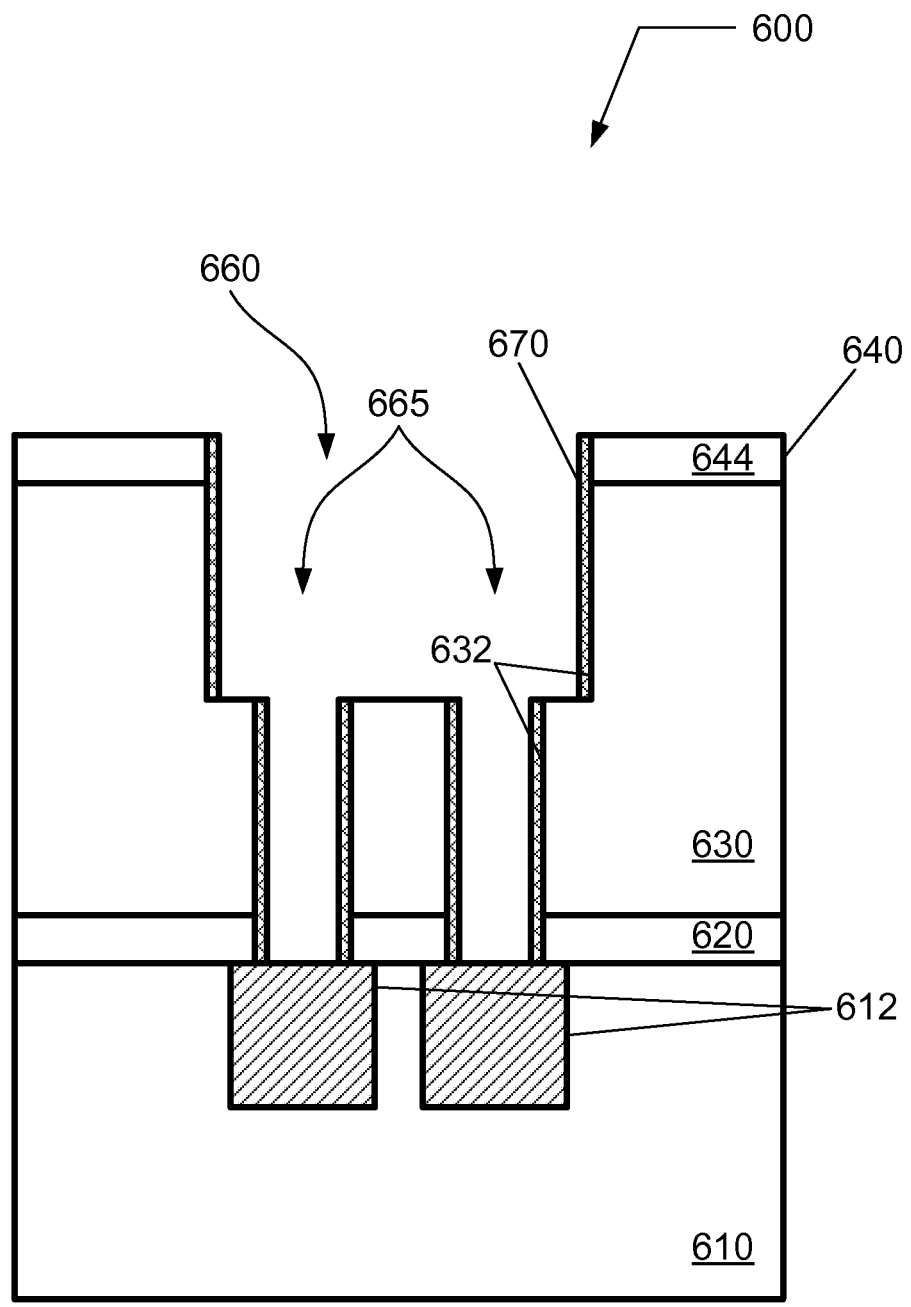

In 540 and as shown in FIG. 6I, a mask removal etching process is performed to remove at least a portion of the second hard mask layer 642. The mask removal etching process may include one or more etching processes. The one or more etching processes may include a dry plasma etching process or a dry non-plasma etching process.

In one embodiment, the dry plasma etching process may include forming plasma from an etching process composition that contains a halogen. For example, the etching process composition may include a fluorine-containing gas, a chlorine-containing gas, a bromine-containing gas, a halide gas, a halocarbon gas (i.e., $C_xR_y$, where R is a halogen element, and x and y are equal to unity or greater), a halohydrocarbon gas ($C_xH_yR_z$, where R is a halogen element, and x and y are equal to unity or greater, and z is equal to zero or greater), or a halomethane gas (e.g., a mono-substituted halomethane, such as $CH_3F$, or a di-substituted halomethane, such as $CH_2F_2$, or a tri-substituted halomethane, such as $CHF_3$, or a tetra-substituted halomethane, such as $CF_4$). Additionally, for example, the etching process composition may include HF, HCl, HBr, $F_2$, $Cl_2$, $Br_2$, $BCl_3$, $NF_3$, or $SF_6$.

Additionally, the dry plasma etching process may include forming plasma from an etching process composition that contains F. For example, the etching process composition may include HF, $NF_3$, $SF_6$, a fluorocarbon gas (i.e., $C_xF_y$, where x and y are equal to unity or greater), a fluorohydrocarbon gas ($C_xH_yF_z$, where x and y are equal to unity or greater, and z is equal to zero or greater), or a fluoromethane gas (e.g., a mono-substituted fluoromethane, such as $CH_3F$, or a di-substituted fluoromethane, such as $CH_2F_2$, or a tri-substituted fluoromethane, such as $CHF_3$, or a tetra-substituted fluoromethane, such as $CF_4$).

Furthermore, for example, the etching process composition may include a noble gas. The etching process composition may include an oxygen-containing gas, a hydrogen-containing gas, a nitrogen-containing gas, or a carbon-containing gas, or any combination of two or more thereof. For example, the etching process composition may include $H_2$, $O_2$, $N_2$, CO, $CO_2$, $NH_3$, NO, $N_2O$, or $NO_2$, or any combination of two or more thereof.

In one embodiment, the etching process composition for the mask removal etching process may include $NF_3$ and optionally a noble gas. In another embodiment, the etching process composition for the mask removal etching process may include $NF_3$ and Ar. In yet another embodiment, the etching process composition for the mask removal etching process may consist of $NF_3$.

The mask removal etching process may include preparation of an etch process recipe. The etch process recipe may include one or more process conditions defined by one or more process parameters. The one or more process conditions may be established by setting one or more process parameters, such as: setting a flow rate of each constituent of the etching process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to the lower electrode, or a source antenna or upper electrode opposing the lower electrode above the substrate; setting a temperature condition for the plasma processing system; setting a temperature condition for the substrate or substrate holder; setting an etch time; and/or setting an over-etch time. During the mask removal etching process, any one of the process parameters may be varied.

Figure 6J:
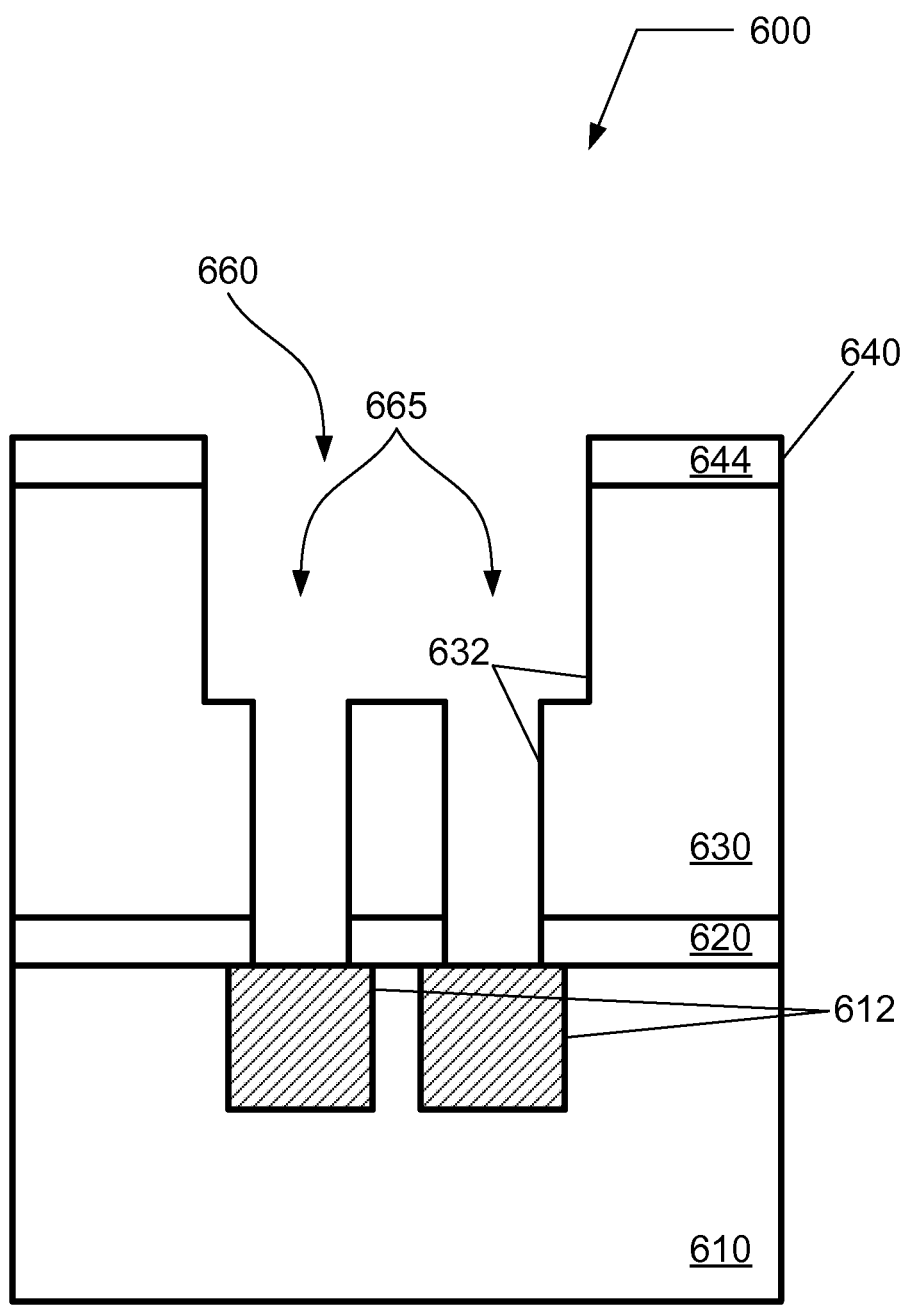

As illustrated in FIG. 6J, following the performing of the mask removal etching process, the remaining portion of the insulation protection layer 670 may be selectively removed from the sidewall surfaces 632 of trench-via structure 600. In one embodiment, the selective removal of the remaining portion of the insulation protection layer 670 from the sidewall surfaces 632 of the trench-via structure 600 is achieved by performing a wet cleaning process. For example, the wet cleaning process may include immersing the remaining portion of the insulation protection layer 670 in an HF solution, such as a dilute aqueous HF solution.

In one embodiment, the deposition process for forming the insulation protection layer, the optional anisotropic plasma etching process, and the mask removal etching process are performed in the same plasma processing system. In an alternate embodiment, the deposition process for forming the insulation protection layer, the optional anisotropic plasma etching process, and the mask removal etching process are performed in separate plasma processing systems.

Figure 7A:
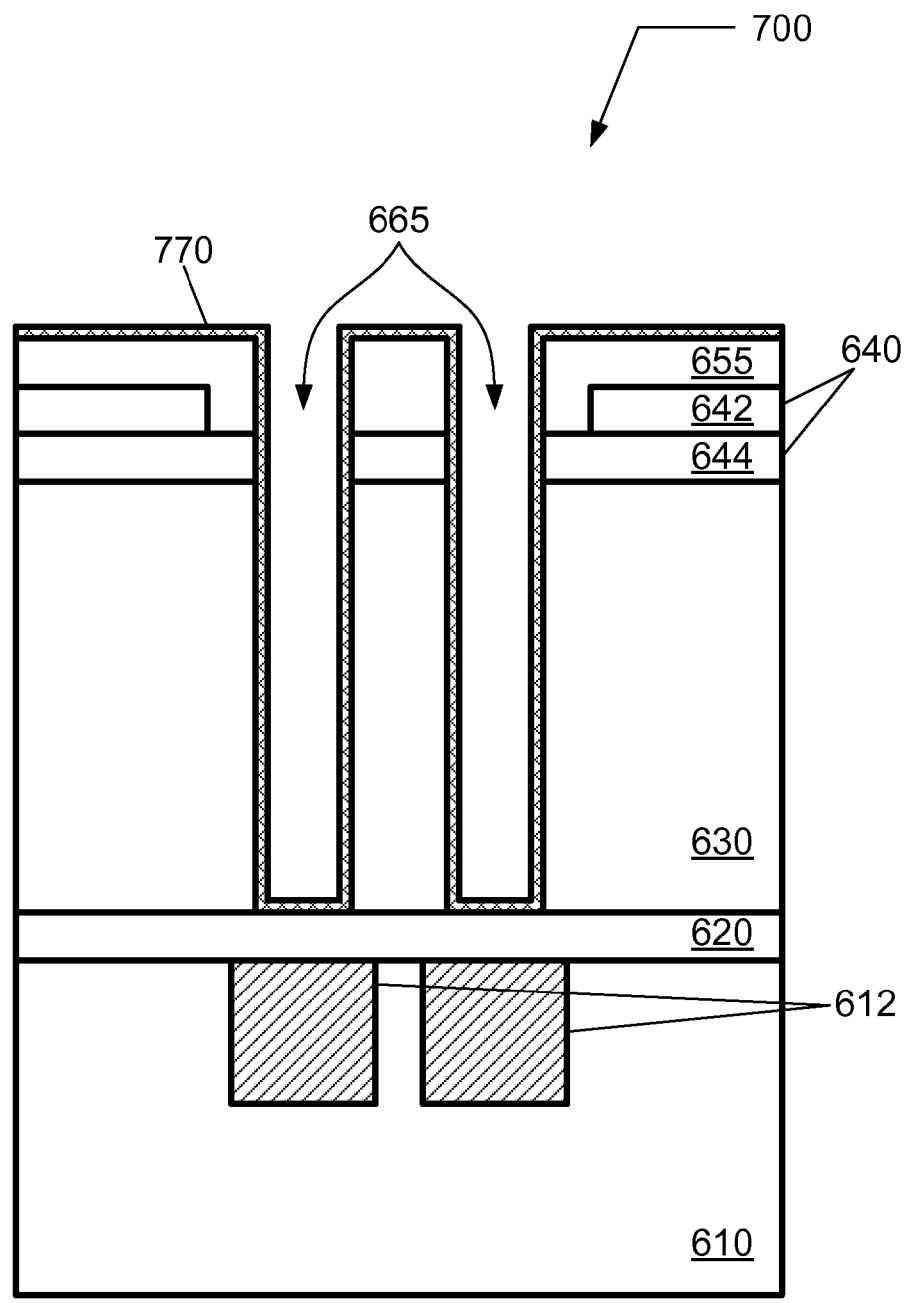
FIGS. 7A through 7B illustrate a schematic representation of a method for patterning a low-k insulation layer while protecting an exposed low-k surface when removing a mask layer according to another embodiment.
Figure 7B:
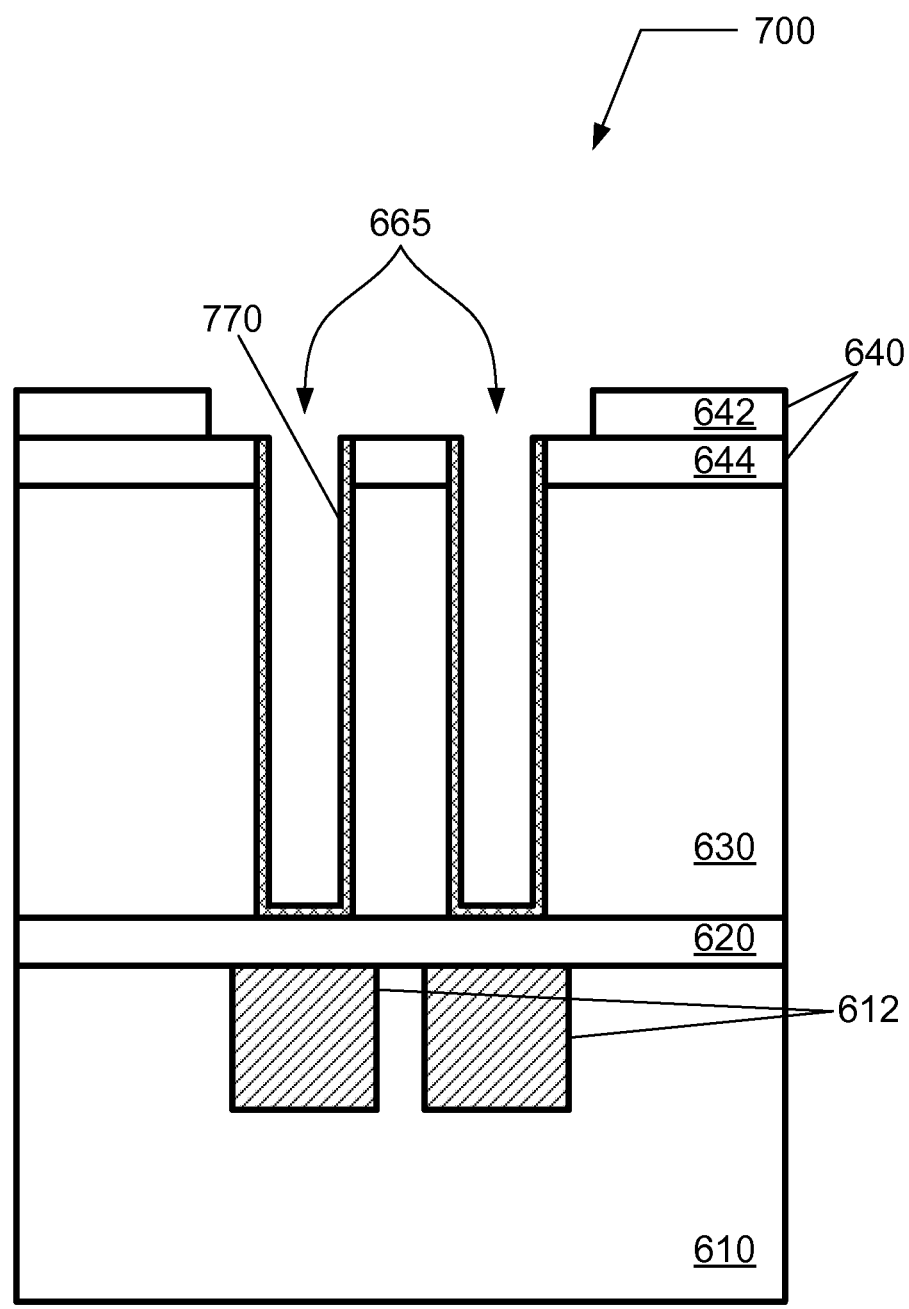

In another embodiment, an insulation protection layer may be deposited before and/or after other steps during the formation of a trench-via structure. As an example, a method for protecting an exposed low-k surface in via pattern 665 of a trench-via structure 700 is illustrated in FIGS. 7A and 7B. As shown in FIG. 7A, following the transferring of the via pattern 665 and prior to transferring the trench pattern 660 into the low-k insulation layer 630, a provisional insulation protection layer may be deposited on exposed surfaces of the via pattern 665 within the trench-via structure 700 to form a via insulation protection layer 770. Immediately following the depositing of the provisional insulation protection layer and preceding the removing of the second lithographic mask layer 655, one or more etching processes may be performed to anisotropically remove at least a portion of the provisional SiOCl-containing layer from at least one surface on the trench-via structure 700. Thereafter, the second lithographic mask layer 655 may be removed as shown in FIG. 7B.

In yet another embodiment, an insulation protection layer may be deposited at multiple stages during a pattern transfer process. In particular, the transfer of the trench pattern 660 and/or via pattern 665 may be performed in discrete etching steps, wherein periodic formation of an insulation protection layer and optional anisotropic removal of at least a portion of the insulation protection layer is inserted between at least one consecutive sequence of discrete etching steps and possibly repeated multiple cycles, e.g., two or more cycles until the sidewall surfaces 632 of a trench-via structure are adequately protected.

Figure 8A:
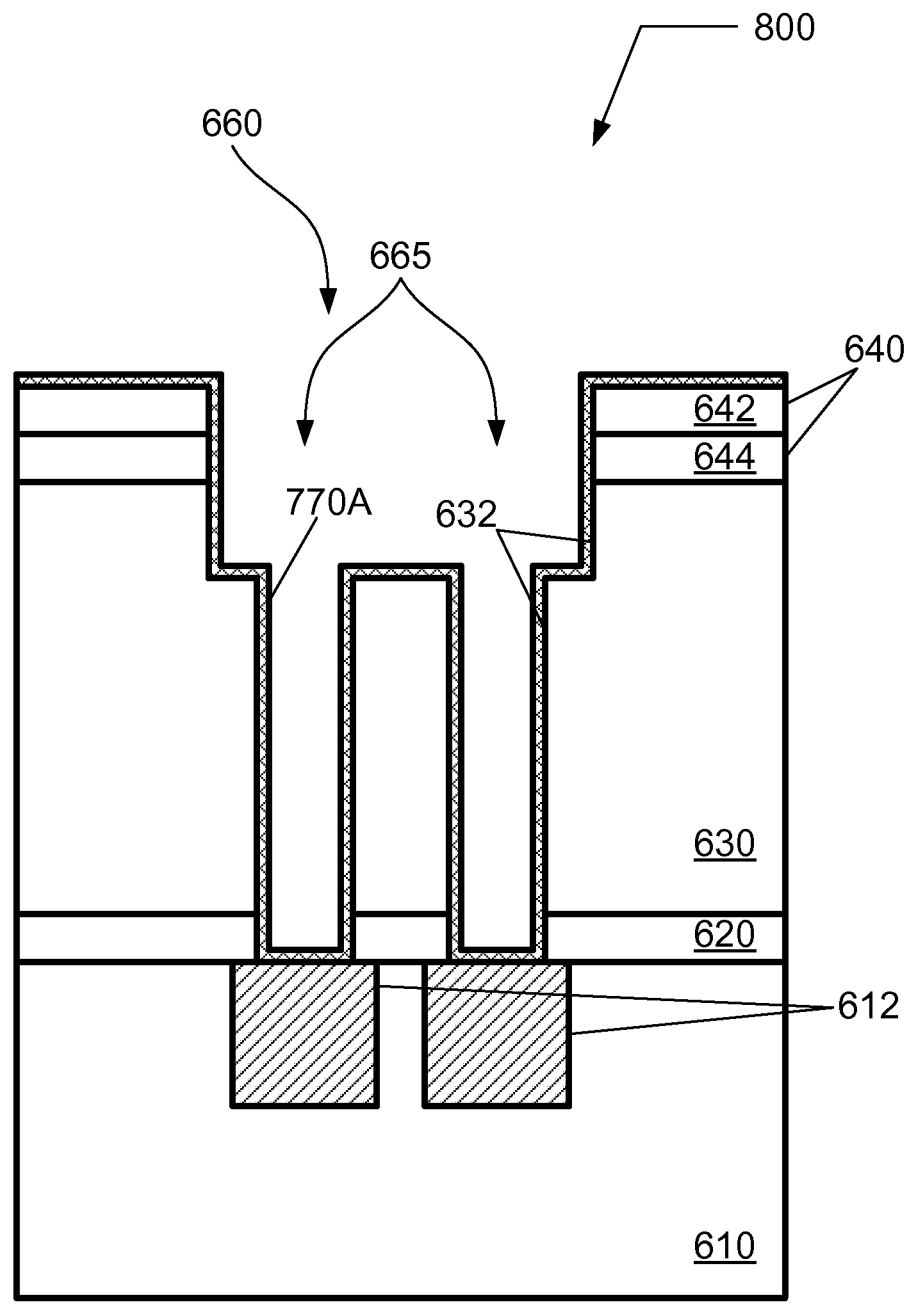
FIGS. 8A through 8C illustrate a schematic representation of a method for patterning a low-k insulation layer while protecting an exposed low-k surface when removing a mask layer according to yet another embodiment.

As an example, a method for protecting an exposed low-k surface in trench pattern 660 of a trench-via structure 800 is described. The method is pictorially illustrated in FIGS. 8A through 8C. As illustrated in FIG. 8A, the trench pattern 660 is partially transferred from the second hard mask layer 642 through the first hard mask layer 644 and into the low-k insulation layer 630 using one or more etching processes to form at least the initial stage of the trench-via structure 800. The initial stage for the transfer of the trench pattern 660 to the low-k insulation layer 630 may be performed to a first trench depth less than the pre-determined depth defined for the trench-via structure 800. At the first trench depth, an intermediate insulation protection layer is deposited on exposed surfaces of the trench-via structure 800 to form a first insulation protection layer 870A.

Figure 8B:
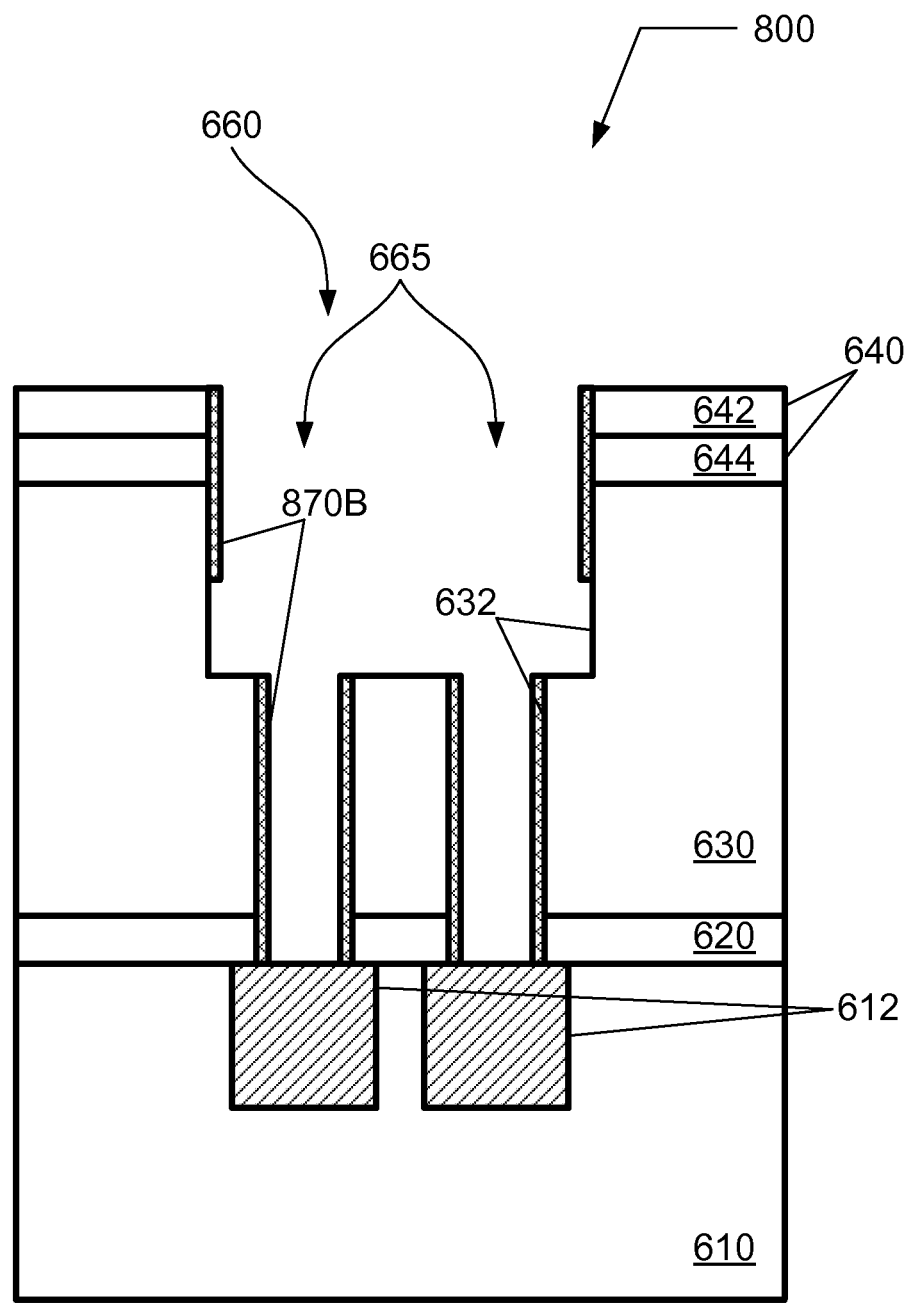

Thereafter, as illustrated in FIG. 8B, the trench pattern 660 is evolved deeper into the low-k insulation layer 630 using one or more additional etching processes. This subsequent stage for the transfer of the trench pattern 660 to the low-k insulation layer 630 may be performed to a second trench depth equal to or less than the pre-determined depth defined for the trench-via structure 800. As shown in FIG. 8B, during the one or more additional etching processes, the first insulation protection layer 870A may be at least partially removed from the second hard mask layer 842 and possibly thinned along the sidewall surfaces 632 of the trench-via structure 800 in low-k insulation layer 630 to leave a residual insulation protection layer 870B. The presence of the residual insulation protection layer 870B on the sidewalls of the evolving trench-via structure 800 may reduce interaction of the low-k insulation layer 630 with the etching chemistry, e.g., plasma chemistry, of the one or more additional etching process.

Figure 8C:
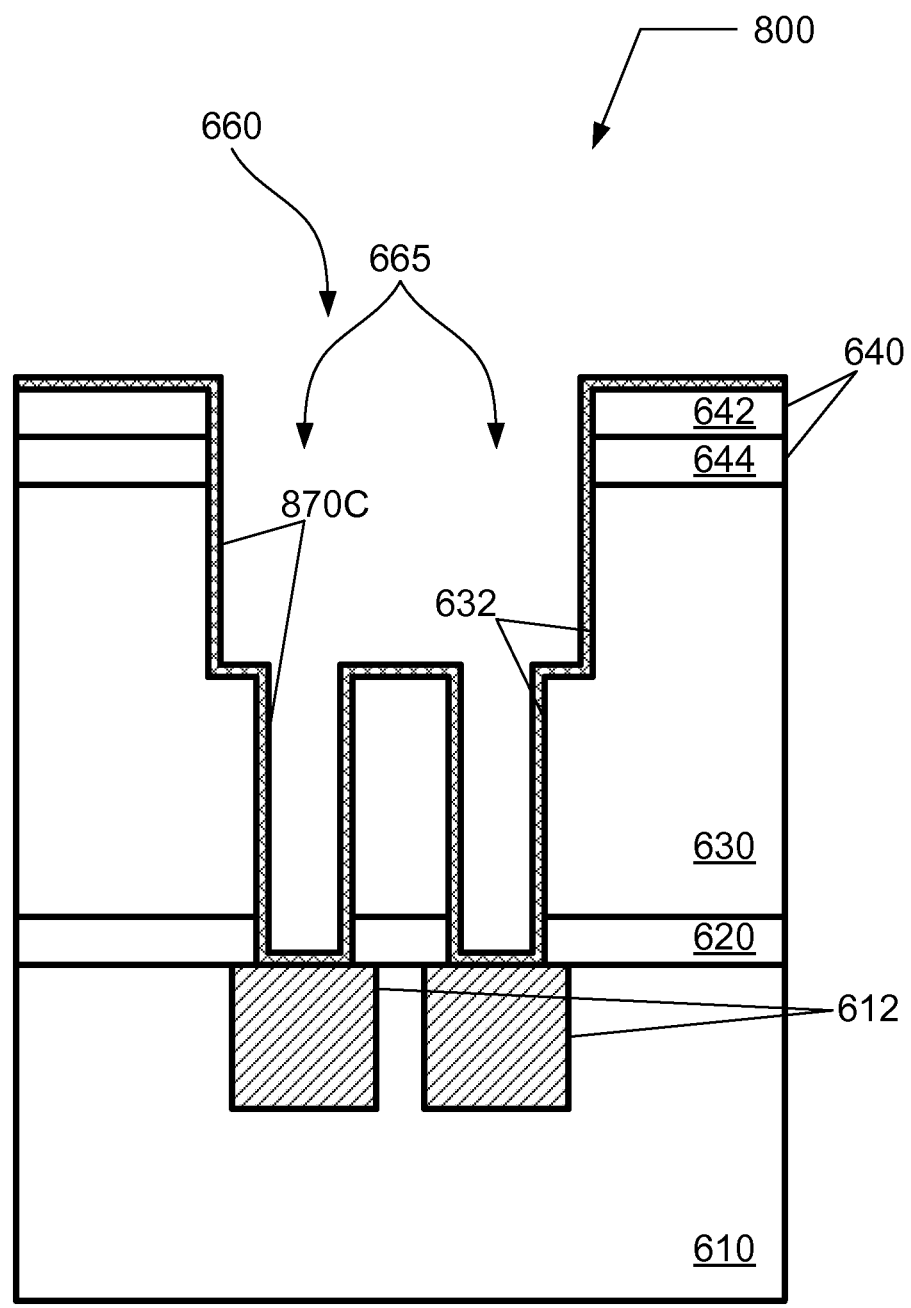

Then, as illustrated in FIG. 8C, another insulation protection layer may be deposited on exposed surfaces of the trench-via structure 800 to form a second insulation protection layer 870C. The sequence of steps, i.e., the etch-deposit-etch-deposit (etc.) scheme described in FIGS. 8A through 8C performed during formation of the trench-via structure 800 into and through low-k insulation layer 630, may protect the sidewalls of the evolving trench-via structure 800 and, thus, limit interaction between the low-k insulation layer 630 and the etch chemistry. The limited interaction may reduce the damage to the low-k insulation layer 630. While described in the context of trench patterning, the etch-deposit sequence may also be performed during via patterning.

TABLE 1

| Substrate | Precursor | F | N | C | O | Si |
|---|---|---|---|---|---|---|
| BD2 | Pyrrole | 0 | 13.9 | 70.3 | 15.9 | 0 |
|  | Aniline | 3.4 | 8.9 | 73.4 | 14.4 | 0 |
| ODL | Pyrrole | 0 | 14.5 | 68.7 | 16.8 | 0 |
|  | Aniline | 3.3 | 8.6 | 72.2 | 15.9 | 0 |
| BD2 | NA | 7.94 | 6.54 | 21.39 | 43.25 | 20.88 |

As an example, the inventor has acquired data for depositing an insulation protection layer on a substrate having a low-k insulation layer and organic dielectric layer (ODL). The low-k insulation layer includes a porous low-k material, such as Black Diamond II (BD2) commercially available from Applied Materials, Inc. An insulation protection layer containing C and N was deposited on the low-k insulation layer and the ODL using pyrrole and aniline as the film-forming precursor. Table 1 provides the elemental composition of the insulation protection layer on both the low-k insulation layer and the ODL for both film-forming precursors. Furthermore, Table 1 provides the elemental composition of the low-k insulation layer without any deposition. The measurement of the elemental composition for select exposed surfaces was made using x-ray photoelectron spectroscopy (XPS).

The inventor observed the elemental composition of the insulation protection layer to be substantially the same for the films deposited on the both the low-k insulation layer and the ODL. Additionally, the inventor has observed reduced to minimal loss of and damage to the low-k insulation layer when performing a subsequent etching, ashing, and/or wet cleaning processes. Furthermore, the inventor has observed the removal of the ODL from the low-k insulation layer using an ashing process following deposition of the insulation protection layer. In other words, the insulation protection layer does not prevent removal of the ODL during the ashing process, yet serves as a sacrificial layer to protect the underlying low-k insulation layer. When attempting to use other material compositions for the insulation protection layer, such other films including Si and C, the inventor has encountered difficulty in removing the ODL.

Figure 9:
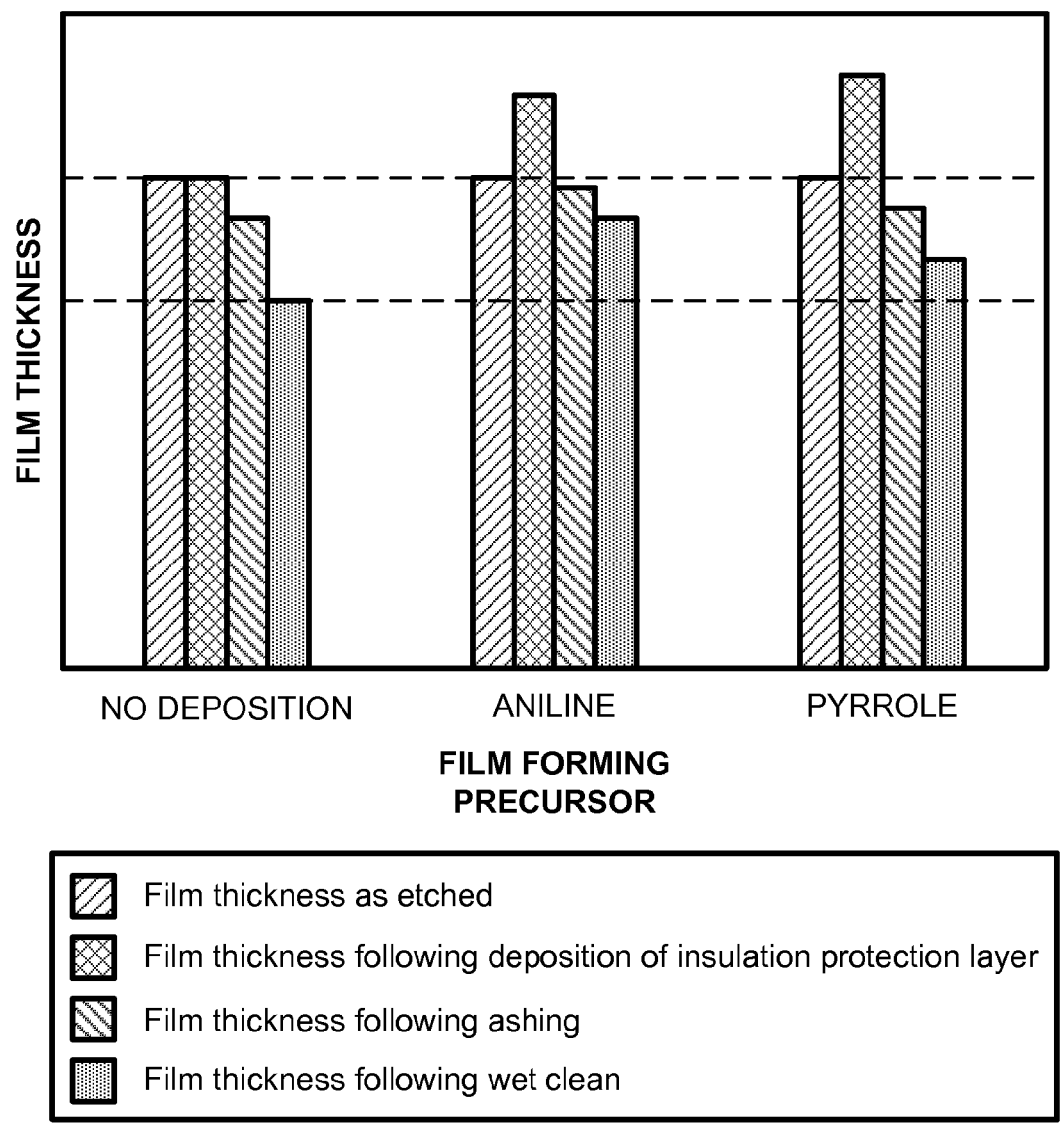
FIG. 9 provides exemplary data for protecting an exposed low-k surface when removing a mask layer.

FIG. 9 provides exemplary data for protecting an exposed low-k surface when removing a mask layer. Therein, a low-k insulation layer is deposited on a substrate having an initial film thickness following an etching process (depicted in FIG. 9 as "Film thickness as etched"). The evolution of the film thickness was measured at various stages subsequent to the etching process, including: (i) Measurement of the film thickness following deposition of an insulation protection layer; (ii) Measurement of the film thickness following an ashing process; and (iii) Measurement of the film thickness following a wet clean process. The evolution of film thickness was measured for several cases, including: (a) the case where an insulation protection layer is not deposited ("No Deposition"); (b) the case where an insulation protection layer is deposited using aniline as a film-forming composition; and (c) the case where an insulation protection layer is deposited using pyrrole as a film-forming composition.

As evidenced in FIG. 9, the inventor observed enhanced protection of the low-insulation layer during subsequent ashing and wet cleaning processes. Further, the inventor concluded that the film thickness of the deposited insulation protection layer can be tailored to prevent any loss of and/or damage to the underlying low-k insulation layer.

One or more of the methods for performing any one of the deposition process for forming the insulation protection layer, the optional anisotropic plasma etching process, the one or more etching processes for transferring the pattern to the low-k insulation layer, and the mask removal process according to various embodiments described above may be performed in any one of the plasma processing systems illustrated in FIGS. 10 through 16 and described below.

Figure 10:
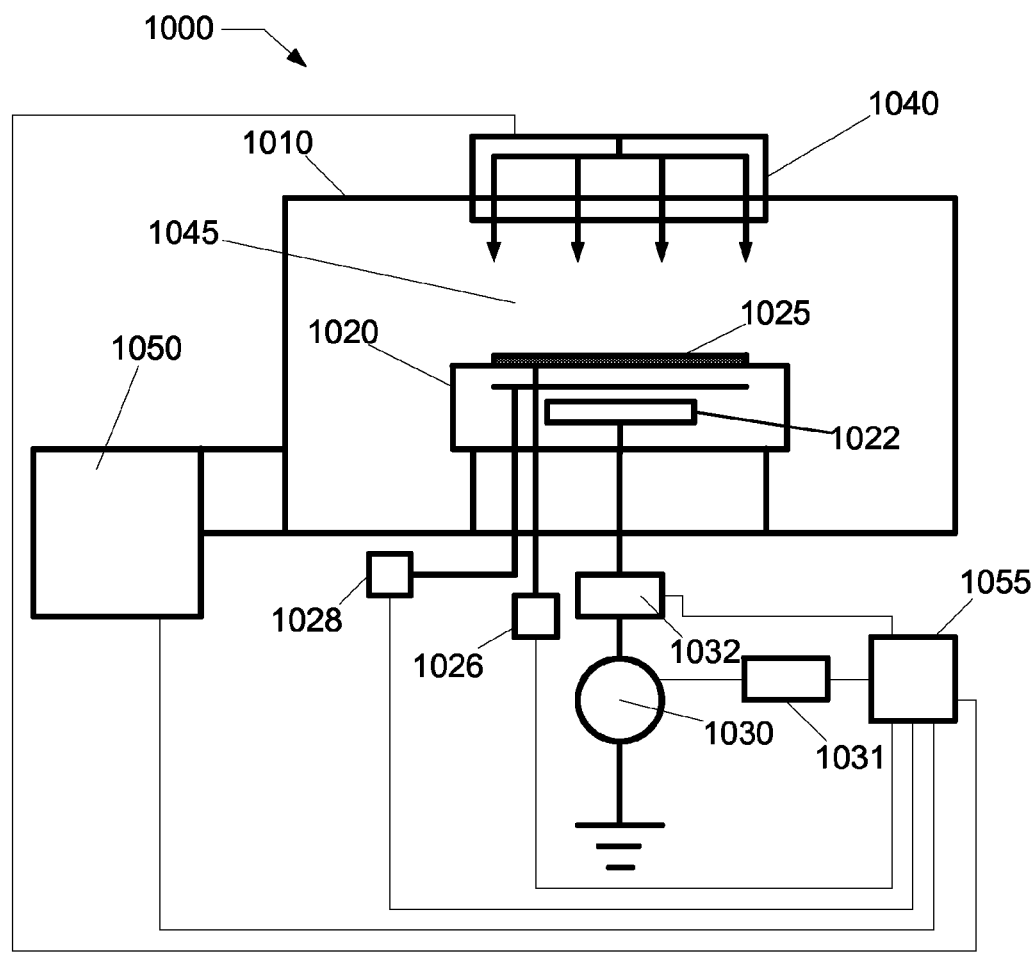
FIG. 10 shows a schematic representation of a plasma processing system according to an embodiment.

According to one embodiment, a plasma processing system 1000 configured to perform the above identified process conditions is depicted in FIG. 10 comprising a plasma processing chamber 1010, substrate holder 1020, upon which a substrate 1025 to be processed is affixed, and vacuum pumping system 1050. Substrate 1025 can be a semiconductor substrate, a wafer, a flat panel display, or a liquid crystal display. Plasma processing chamber 1010 can be configured to facilitate the generation of plasma in plasma processing region 1045 in the vicinity of a surface of substrate 1025. An ionizable gas or mixture of process gases is introduced via a gas distribution system 1040. For a given flow of process gas, the process pressure is adjusted using the vacuum pumping system 1050. Plasma can be utilized to create materials specific to a pre-determined materials process, and/or to aid the removal of material from the exposed surfaces of substrate 1025. The plasma processing system 1000 can be configured to process substrates of any desired size, such as 200 mm substrates, 300 mm substrates, or larger.

Substrate 1025 can be affixed to the substrate holder 1020 via a clamping system 1028, such as a mechanical clamping system or an electrical clamping system (e.g., an electrostatic clamping system). Furthermore, substrate holder 1020 can include a heating system (not shown) or a cooling system (not shown) that is configured to adjust and/or control the temperature of substrate holder 1020 and substrate 1025. The heating system or cooling system may comprise a re-circulating flow of heat transfer fluid that receives heat from substrate holder 1020 and transfers heat to a heat exchanger system (not shown) when cooling, or transfers heat from the heat exchanger system to substrate holder 1020 when heating. In other embodiments, heating/cooling elements, such as resistive heating elements, or thermo-electric heaters/coolers can be included in the substrate holder 1020, as well as the chamber wall of the plasma processing chamber 1010 and any other component within the plasma processing system 1000.

Additionally, a heat transfer gas can be delivered to the backside of substrate 1025 via a backside gas supply system 1026 in order to improve the gas-gap thermal conductance between substrate 1025 and substrate holder 1020. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 1025.

In the embodiment shown in FIG. 10, substrate holder 1020 can comprise an electrode 1022 through which RF power is coupled to the processing plasma in plasma processing region 1045. For example, substrate holder 1020 can be electrically biased at a RF voltage via the transmission of RF power from a RF generator 1030 through an optional impedance match network 1032 to substrate holder 1020. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 1022 at a RF voltage may be pulsed using pulsed bias signal controller 1031. The RF power output from the RF generator 1030 may be pulsed between an off-state and an on-state, for example.

Alternately, RF power is applied to the substrate holder electrode at multiple frequencies. Furthermore, impedance match network 1032 can improve the transfer of RF power to plasma in plasma processing chamber 1010 by reducing the reflected power. Match network topologies (e.g. L-type, π-type, T-type, etc.) and automatic control methods are well known to those skilled in the art.

Gas distribution system 1040 may comprise a showerhead design for introducing a mixture of process gases. Alternatively, gas distribution system 1040 may comprise a multi-zone showerhead design for introducing a mixture of process gases and adjusting the distribution of the mixture of process gases above substrate 1025. For example, the multi-zone showerhead design may be configured to adjust the process gas flow or composition to a substantially peripheral region above substrate 1025 relative to the amount of process gas flow or composition to a substantially central region above substrate 1025.

Vacuum pumping system 1050 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 1010.

Controller 1055 comprises a microprocessor, memory, and a digital I/O port capable of generating control voltages sufficient to communicate and activate inputs to plasma processing system 1000 as well as monitor outputs from plasma processing system 1000. Moreover, controller 1055 can be coupled to and can exchange information with RF generator 1030, pulsed bias signal controller 1031, impedance match network 1032, the gas distribution system 1040, vacuum pumping system 1050, as well as the substrate heating/cooling system (not shown), the backside gas supply system 1026, and/or the electrostatic clamping system 1028. For example, a program stored in the memory can be utilized to activate the inputs to the aforementioned components of plasma processing system 1000 according to a process recipe in order to perform a plasma assisted process, such as a plasma etch process, on substrate 1025.

Controller 1055 can be locally located relative to the plasma processing system 1000, or it can be remotely located relative to the plasma processing system 1000. For example, controller 1055 can exchange data with plasma processing system 1000 using a direct connection, an intranet, and/or the internet. Controller 1055 can be coupled to an intranet at, for example, a customer site (i.e., a device maker, etc.), or it can be coupled to an intranet at, for example, a vendor site (i.e., an equipment manufacturer). Alternatively or additionally, controller 1055 can be coupled to the internet. Furthermore, another computer (i.e., controller, server, etc.) can access controller 1055 to exchange data via a direct connection, an intranet, and/or the internet.

In the embodiment shown in FIG. 11, plasma processing system 1100 can be similar to the embodiment of FIG. 10 and further comprise either a stationary, or mechanically or electrically rotating magnetic field system 1160, in order to potentially increase plasma density and/or improve plasma processing uniformity, in addition to those components described with reference to FIG. 10. Moreover, controller 1055 can be coupled to magnetic field system 1160 in order to regulate the speed of rotation and field strength. The design and implementation of a rotating magnetic field is well known to those skilled in the art.

Figure 11:
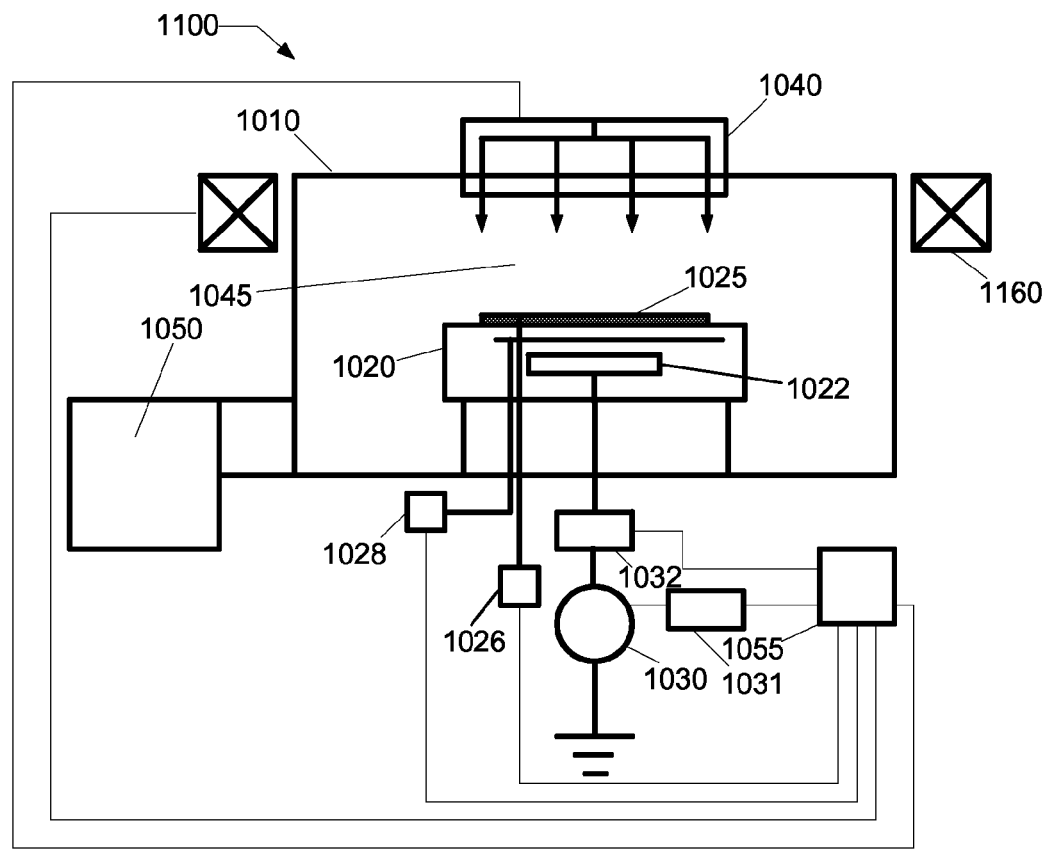
FIG. 11 shows a schematic representation of a plasma processing system according to another embodiment.
Figure 12:
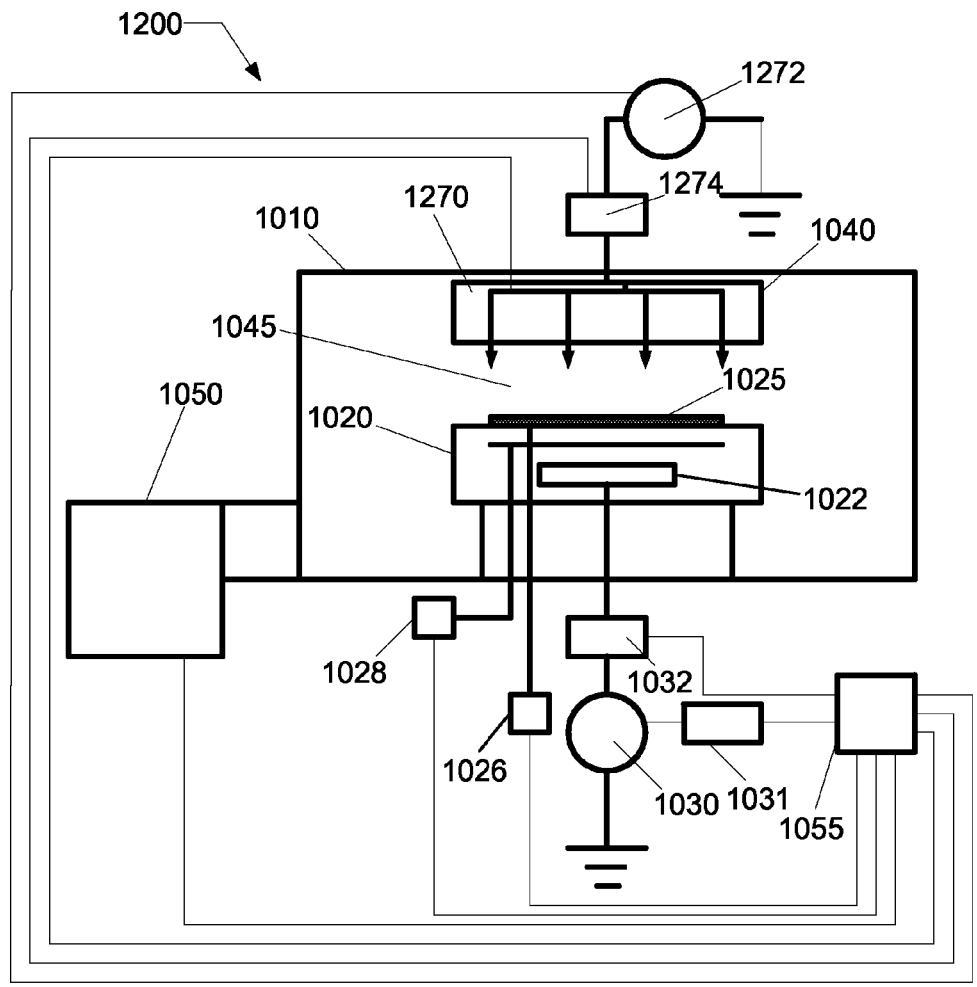
FIG. 12 shows a schematic representation of a plasma processing system according to another embodiment.

In the embodiment shown in FIG. 12, plasma processing system 1200 can be similar to the embodiment of FIG. 10 or FIG. 11, and can further comprise an upper electrode 1270 to which RF power can be coupled from RF generator 1272 through optional impedance match network 1274. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 1055 is coupled to RF generator 1272 and impedance match network 1274 in order to control the application of RF power to upper electrode 1270. The design and implementation of an upper electrode is well known to those skilled in the art. The upper electrode 1270 and the gas distribution system 1040 can be designed within the same chamber assembly, as shown. Alternatively, upper electrode 1270 may comprise a multi-zone electrode design for adjusting the RF power distribution coupled to plasma above substrate 1025. For example, the upper electrode 1270 may be segmented into a center electrode and an edge electrode.

Figure 13:
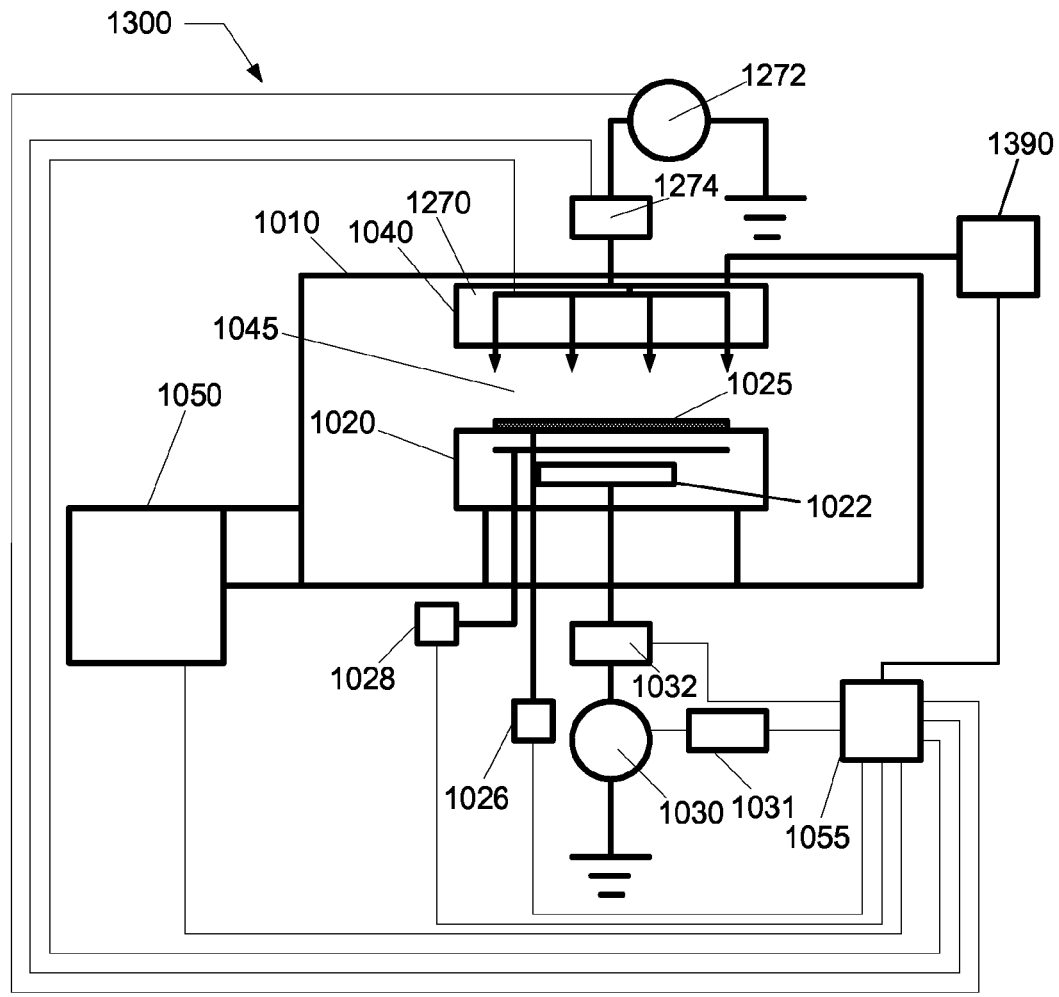
FIG. 13 shows a schematic representation of a plasma processing system according to another embodiment.

In the embodiment shown in FIG. 13, plasma processing system 1300 can be similar to the embodiment of FIG. 12, and can further comprise a direct current (DC) power supply 1390 coupled to the upper electrode 1270 opposing substrate 1025. The upper electrode 1270 may comprise an electrode plate. The electrode plate may comprise a silicon-containing electrode plate. Moreover, the electrode plate may comprise a doped silicon electrode plate. The DC power supply 1390 can include a variable DC power supply. Additionally, the DC power supply 1390 can include a bipolar DC power supply. The DC power supply 1390 can further include a system configured to perform at least one of monitoring, adjusting, or controlling the polarity, current, voltage, or on/off state of the DC power supply 1390. Once plasma is formed, the DC power supply 1390 facilitates the formation of a ballistic electron beam. An electrical filter (not shown) may be utilized to de-couple RF power from the DC power supply 1390.

For example, the DC voltage applied to upper electrode 1270 by DC power supply 1390 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 1270. The surface of the upper electrode 1270 facing the substrate holder 1020 may be comprised of a silicon-containing material.

Figure 14:
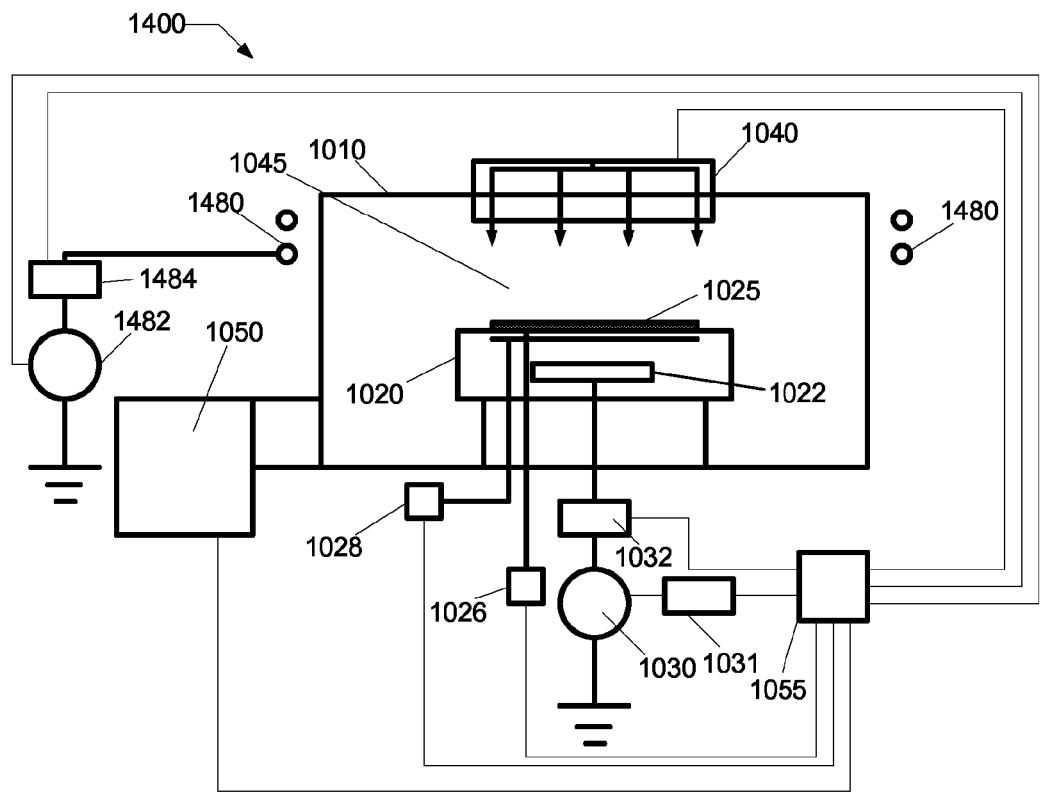
FIG. 14 shows a schematic representation of a plasma processing system according to another embodiment.

In the embodiment shown in FIG. 14, plasma processing system 1400 can be similar to the embodiments of FIGS. 10 and 11, and can further comprise an inductive coil 1480 to which RF power is coupled via RF generator 1482 through optional impedance match network 1484. RF power is inductively coupled from inductive coil 1480 through a dielectric window (not shown) to plasma processing region 1045. A frequency for the application of RF power to the inductive coil 1480 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 1480 and plasma in the plasma processing region 1045. Moreover, controller 1055 can be coupled to RF generator 1482 and impedance match network 1484 in order to control the application of power to inductive coil 1480.

Figure 15:
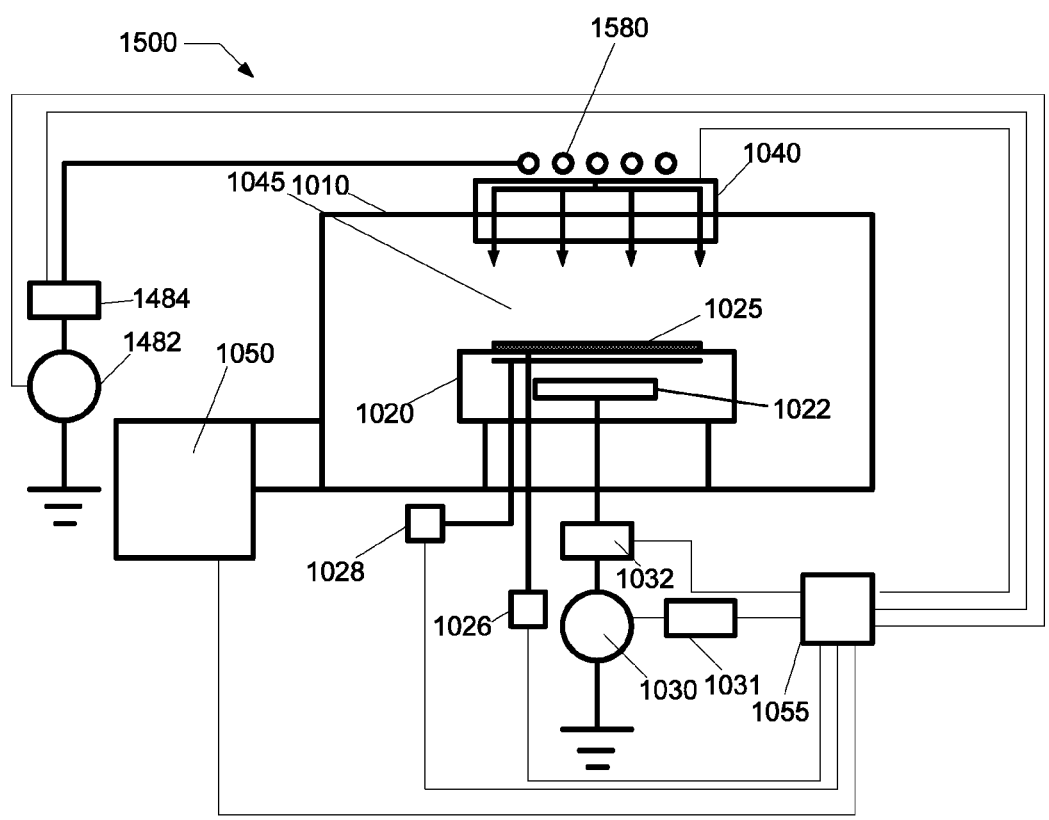
FIG. 15 shows a schematic representation of a plasma processing system according to another embodiment.

In an alternate embodiment, as shown in FIG. 15, plasma processing system 1500 can be similar to the embodiment of FIG. 14, and can further comprise an inductive coil 1580 that is a "spiral" coil or "pancake" coil in communication with the plasma processing region 1045 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 16:
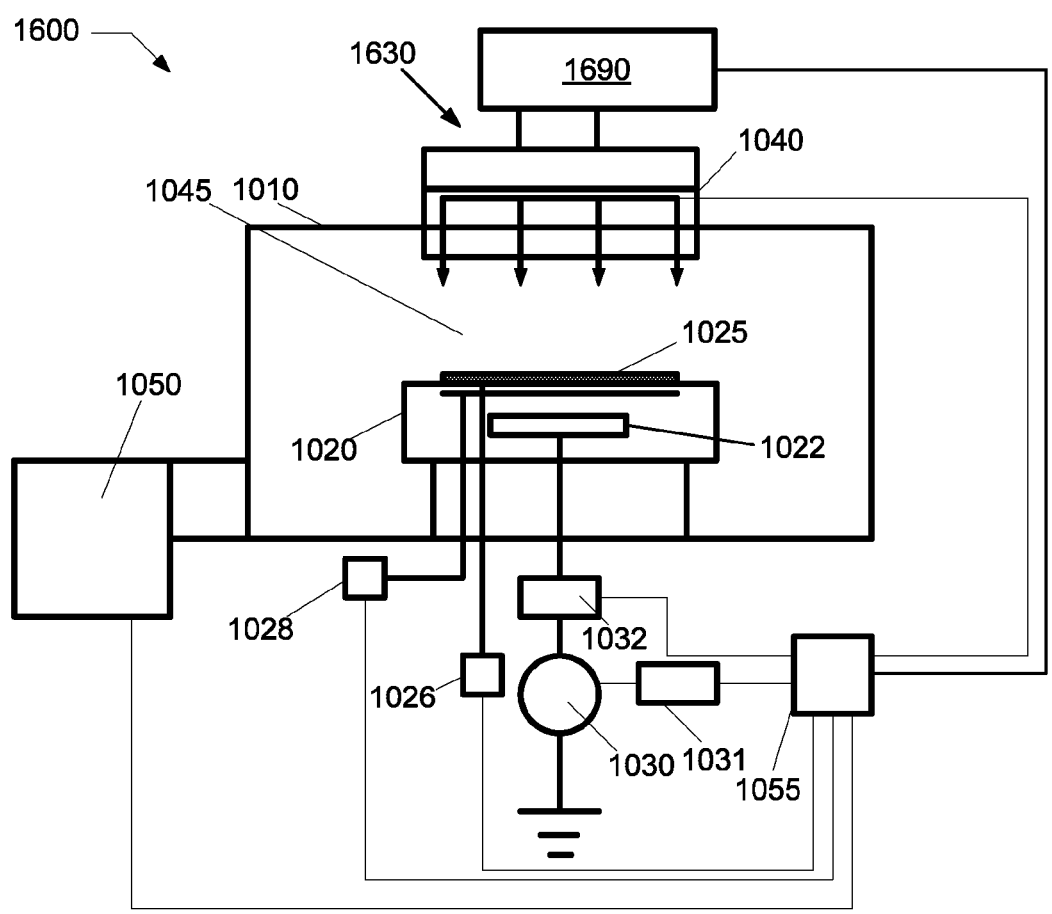
FIG. 16 shows a schematic representation of a plasma processing system according to another embodiment.

In the embodiment shown in FIG. 16, plasma processing system 1100 can be similar to the embodiment of FIG. 10, and can further comprise a surface wave plasma (SWP) source 1630. The SWP source 1630 can comprise a slot antenna, such as a radial line slot antenna (RLSA), to which microwave power is coupled via a power coupling system 1690.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for protecting an exposed low-k surface, comprising:
    providing a substrate having a low-k insulation layer formed thereon and one or more mask layers overlying said low-k insulation layer with a pattern formed therein;
    transferring said pattern in said one or more mask layers to said low-k insulation layer using one or more etching processes to form a structural feature in said low-k insulation layer;
    forming an insulation protection layer on exposed surfaces of said structural feature following said one or more etching processes, and prior to mask removal, by exposing said substrate to a film forming process composition containing C, H, and N; and
    removing at least a portion of said one or more mask layers using a mask removal process after forming the insulation protection layer.

2. The method of claim 1, further comprising:
    anisotropically removing said insulation protection layer from a top surface of said one or more mask layers and a bottom surface of said structural feature in said low-k insulation layer, while retaining a remaining portion of said insulation protection layer on sidewall surfaces of said structural feature.

3. The method of claim 1, wherein said film forming process composition is a heterocyclic aromatic organic compound or an aromatic amine.

4. The method of claim 1, wherein said film forming process composition is pyrrole ($C_4H_4NH$) or aniline ($C_6H_5NH_2$).

5. The method of claim 1, wherein said forming said insulation protection layer comprises performing a plasma-assisted deposition process that includes generating plasma;

wherein said plasma-assisted deposition process excludes application of a radio frequency (RF) bias to a substrate holder upon which said substrate rests;

wherein a temperature of said substrate ranges from about 50 degrees C. to about 100 degrees C.; and wherein a pressure ranges from about 200 mTorr to about 1000 mTorr.

6. The method of claim 5, wherein said performing said plasma-assisted deposition process comprises adjusting at least one process parameter in said plasma-assisted deposition process to increase an etch resistance of said insulation protection layer to said mask removal process.

7. The method of claim 1, wherein said one or more mask layers comprises one or more layers selected from the group consisting of a soft mask layer, a hard mask layer, a layer of radiation-sensitive material, an anti-reflective coating (ARC) layer, an organic planarization layer (OPL), or an organic dielectric layer (ODL); and wherein said low-k insulation layer comprises a dielectric constant less than a value of 2.5.

8. The method of claim 7, wherein said hard mask layer comprises a metal hard mask layer; and wherein said structural feature is formed using a trench-first metal hard mask scheme or a via-first trench-last scheme.

9. The method of claim 8, wherein said hard mask layer comprises TiN.

10. The method of claim 1, wherein said insulation protection layer contains C and N.

11. The method of claim 1, wherein said insulation protection layer contains C, N, and O.

12. The method of claim 1, further comprising:

following said removing at least a portion of said one or more mask layers, selectively removing any remaining portion of said insulation protection layer from said exposed surfaces of said structural feature.

13. The method of claim 1, wherein said transferring said pattern and said forming said insulation protection layer are alternatingly and sequentially performed multiple cycles until said pattern transfer is completed in said low-k insulation layer.

14. The method of claim 1, wherein said transferring said pattern comprises:

receiving said substrate having said low-k insulation layer formed thereon, a first hard mask layer overlying said low-k insulation layer, and a second hard mask layer overlying said first hard mask layer, wherein said second hard mask layer contains a metal;

preparing a first lithographic mask layer with a trench pattern formed therein on said second hard mask layer;

transferring said trench pattern into said second hard mask layer and stopping on said first hard mask layer;

removing said first lithographic mask layer;

preparing a second lithographic mask layer with a via pattern formed therein on said second hard mask layer;

transferring said via pattern through said first hard mask layer and at least partially through said low-k insulation layer;

removing said second lithographic mask layer; and transferring said trench pattern in said second hard mask layer through said first hard mask layer and into said low-k insulation layer to a pre-determined depth to form said structural feature, said structural feature being a trench-via structure.

15. A method for protecting an exposed low-k surface, comprising:

providing a substrate having a low-k insulation layer formed thereon and one or more mask layers overlying said low-k insulation layer with a pattern formed therein;

transferring said pattern in said one or more mask layers to said low-k insulation layer using one or more etching processes to form a structural feature in said low-k insulation layer;

forming an insulation protection layer on exposed surfaces of said structural feature during said one or more etching processes by exposing said substrate to a film forming process composition, the process composition having a compound containing C, H, and N, wherein said film forming process composition is pyrrole ($C_4H_4NH$), said forming said insulation protection layer comprises performing a plasma-assisted deposition process that includes generating plasma, wherein said insulation protection layer contains C, N, and O, and wherein said insulation protection layer does not contain silicon, wherein the insulation protection layer is formed prior to mask removal;

removing at least a portion of said one or more mask layers using a mask removal process; and anisotropically removing said insulation protection layer from a top surface of said one or more mask layers and a bottom surface of said structural feature in said low-k insulation layer, while retaining a remaining portion of said insulation protection layer on sidewall surfaces of said structural feature.

16. The method of claim 15, wherein said film forming process composition is aniline ($C_6H_5NH_2$).

* * * * *